United States Patent
Hooley et al.

(10) Patent No.: US 7,224,813 B2
(45) Date of Patent: May 29, 2007

(54) LOUDSPEAKER USING AN ELECTRO-ACTIVE DEVICE

(75) Inventors: Anthony Hooley, Cambridge (GB); David Henry Pearce, Birmingham (GB); Gareth McKevitt, Cambridge (GB); Mark Richard Shepherd, Herfordshire (GB); James Allan, Suffolk (GB); Simon Andrew Longbottom, Cambridge (GB); Ursula Ruth Lenel, Hertfordshire (GB)

(73) Assignee: 1 . . . Limited, Cambridge (GB)

( * ) Notice: Subject to any disclaimer, the term of this patent is extended or adjusted under 35 U.S.C. 154(b) by 988 days.

(21) Appl. No.: 10/168,736

(22) PCT Filed: Dec. 21, 2000

(86) PCT No.: PCT/GB00/04953

§ 371 (c)(1),
(2), (4) Date: Oct. 10, 2002

(87) PCT Pub. No.: WO01/47318

PCT Pub. Date: Jun. 28, 2001

(65) Prior Publication Data

US 2003/0095678 A1    May 22, 2003

(30) Foreign Application Priority Data

Dec. 21, 1999 (GB) ................... 9930010.5
Feb. 14, 2000 (GB) ................... 0003136.9
Aug. 24, 2000 (GB) ................... 0020941.1

(51) Int. Cl.
*H04R 25/00* (2006.01)

(52) U.S. Cl. ............... 381/190; 381/396; 381/430

(58) Field of Classification Search ......... 381/173, 381/182, 190–191, 396, 430; 310/333, 358, 310/365, 367, 369
See application file for complete search history.

(56) References Cited

U.S. PATENT DOCUMENTS 3,816,774 A    6/1974    Ohnuki et al. ............... 310/8.6

(Continued)

FOREIGN PATENT DOCUMENTS

DE    1 195 448    3/1971

(Continued)

OTHER PUBLICATIONS

B.L.Jiao & J.D. Zhang; Torsional Modes in Piezo Helical Springs; IEEE Transactions on Ultrasonics, Ferroelectronics, and Frequency Control; vol. 46, No. 1, Jan. 1999.

(Continued)

*Primary Examiner*—Suhan Ni
(74) *Attorney, Agent, or Firm*—Gerry J. Elman; Elman Technology Law, P.C.

(57) ABSTRACT

A loudspeaker comprising: a support, a sound-generating element mounted to the support for vibration to generate sound; and an electro-active device coupled between the support and the sound-generating element for vibrating the sound-generating element in response to an electrical signal. The electro-active device comprises a structure extending along a minor axis which extends in a curve around a major axis parallel to the vibration direction of the sound-generating element, the structure comprising successive electro-active portions arranged with electrodes to bend around the minor axis on activation in response to application of the electrical signal to the electrodes, and coupled together such that bending of successive portions causes concomitant rotation of adjacent portions around the minor axis adding incrementally along the minor axis, which rotation causes concomitant change of the axial length of the structure along the major axis.

38 Claims, 21 Drawing Sheets

U.S. PATENT DOCUMENTS

| | | | | |
|---|---|---|---|---|
| 3,900,748 A | 8/1975 | Adler | | 310/9.6 |
| 4,330,730 A | 5/1982 | Kurz et al. | | 310/331 |
| 4,601,539 A | 7/1986 | Watanabe | | |
| 4,638,207 A | 1/1987 | Radice | | 310/328 |
| 4,768,173 A | 8/1988 | Gautier et al. | | |
| 5,103,483 A * | 4/1992 | Klein | | 381/190 |
| 5,440,194 A | 8/1995 | Beurrier | | 310/328 |
| 5,526,601 A | 6/1996 | Onuma et al. | | 43/17 |

FOREIGN PATENT DOCUMENTS

| | | |
|---|---|---|
| DE | 1945448 | 3/1971 |
| EP | 0 251 901 | 1/1988 |
| GB | 2 322 232 A | 8/1998 |
| GB | 2322232 A | 8/1998 |
| GB | 2 329 514 A | 3/1999 |
| JP | 11-064096 | 3/1999 |
| JP | 11064096 | 3/1999 |
| WO | WO 98/09339 | 3/1998 |
| WO | WO 98/34434 | 8/1998 |
| WO | WO 99/54626 | 10/1999 |

OTHER PUBLICATIONS

Dancila, D.S. et al; Large Displacement Piezoelectric Actuator Configurations; Adaptive Structures and Material Systems; Nov. 15-20, 1998; pp. 83-87; XP001004521, ASME, New York, New York, NY.

* cited by examiner

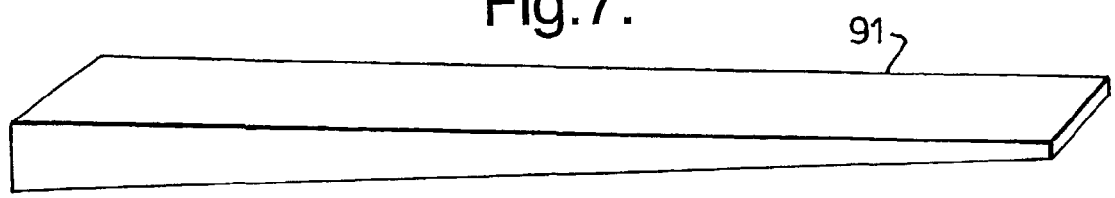
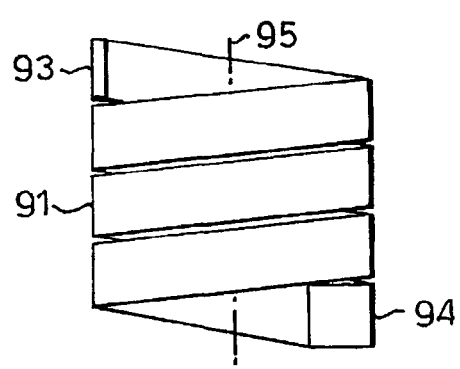
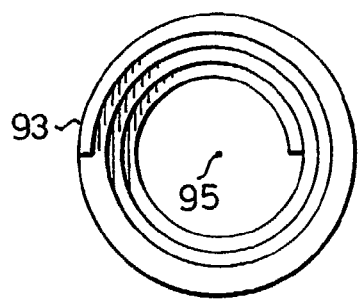
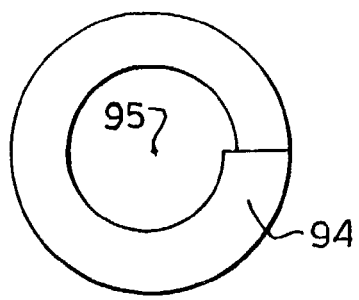
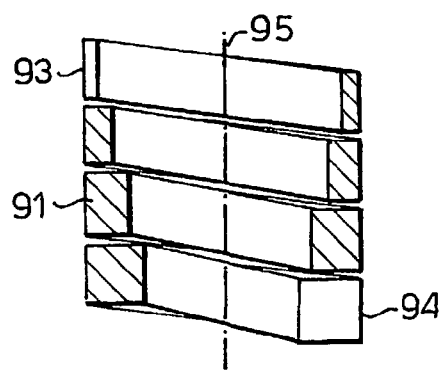

LOUDSPEAKER USING AN ELECTRO-ACTIVE DEVICE

This invention relates to a loudspeaker using an electro-active device. More particularly, the invention relates to the use of an electro-active device having a particular construction to vibrate the sound-generating member of a loudspeaker in response to an electrical signal applied to the electro-active device.

The present invention is applicable to any type of loudspeaker, that is any type of transducer for generating sound, including sound outside the audible range. In general, loudspeakers comprise a sound-generating element mounted to a support for vibration relative to the support to generate sound. The sound-generating element may be a cone, as for example in a hi-fi loudspeaker, but may take different forms in other types of loudspeaker. For example in a small loudspeaker it can be a simple plate or piston.

To drive the sound-generating element, a transducer is coupled between the support and the sound-generating element for vibrating the sound-generating element in response to an electrical signal applied to the transducer. Typically the transducer is in the form of a coil in a magnetic field driven by electromagnetic induction. Such coils as transducers suffer from a number of problems, such as having a large size and weight and a limited frequency bandwidth especially at low frequencies. It would be desirable to provide a transducer which allows at least one of these disadvantages to be alleviated.

It has been considered to use a piezo-electric device as the transducer for a loudspeaker. However piezo-electric devices have not found practical application as loudspeaker transducers due to problems with achieving sufficient mechanical displacement and sufficient linearity in the path of the mechanical displacement.

Simple piezoelectric devices are merely blocks of piezoelectric material. However the change in dimensions of such a piezoelectric block on electrical activation is very small, typically less than a micron ($1 \times 10^{-6}$ m), so such simple piezoelectric devices do not produce sufficient mechanical displacement to be used in a loudspeaker.

Larger displacement, of the order of millimeters, may be achieved by a piezoelectric device known as a "bender", that is a device having plural layers, at least one layer being of piezoelectric material and further layers being either piezoelectric or inactive. On electrical activation, the piezoelectric material expands or contracts along the layers and differential change in length between the layers causes bending perpendicular to the layers due to them being constrained at the joined faces. However, the displacement is not linear, because it follows a curved path in space because the device bends. Also, a bender capable of sufficient displacement is inconveniently large, say of several cm length to achieve several mm displacement. Thus such a bender is not suitable for use as the transducer in a loudspeaker.

According to the present invention, there is provided a loudspeaker, comprising: a support; a sound-generating element mounted relative to the support for vibration to generate sound; and an electro-active device coupled to the sound-generating element for vibrating the sound-generating element in response to an electrical signal, the electro-active device comprising a structure extending along a minor axis which extends in a curve around a major axis parallel to the vibration direction of the sound-generating element, the structure comprising successive electro-active portions arranged with electrodes to bend around the minor axis on activation in response to application of the electrical signal to the electrodes, and coupled together such that bending of successive portions causes concomitant rotation of adjacent portions around the minor axis adding incrementally along the minor axis, which rotation causes concomitant change of the axial length of the structure along the major axis.

The electro-active device has a structure which causes its axial length to change in response to the electrical signal, thereby allowing it to drive the vibration of the sound-generating element. This displacement of the electro-active structure is associated with the rotation of the structure and can be understood as follows.

The displacement derives from (a) the rotation of the structure around the minor axis and (b) the curve of the minor axis along which the structure extends around the major axis (hereinafter called the major curve, for ease of reference).

The rotation occurs as follows. Because the successive electro-active portions bend around the minor axis, bending of each portion relatively rotates the adjacent portions around the minor axis. In this way bending of the successive electro-active portions is concomitant with rotation of the structure as a whole around the minor axis. The rotation adds incrementally along the length of the minor axis. Accordingly there is a net relative rotation between the ends of the structure. When electrically activated an electrical signal applied to the electrodes causes such rotation.

Now consider a small section of the structure along the minor axis. As described above, bending of the portions within the section causes rotation of the structure within the section about the minor axis. The section is curved. As a general point, it will be understood that internal rotation of a curved object creates movement of the object out of the plane of its curve. In the present structure, the rotation within the individual section around the minor axis causes the section to move out of the plane of the curve, that is along the major axis. This may be visualised as the rotation in the given section displacing adjacent sections along the major axis because those adjacent sections extend at a slight angle to the given section due to the major curve. This is equivalent to an extension or contraction of that section along the direction out of the plane of the curve. It is also equivalent to a change in orientation of the section, that is from an orientation in the plane of the curve to an orientation at an angle to the plane of the curve. In fact, the amount of displacement will be proportional to the degree of rotation within the section and the degree of curvature of the section.

The net displacement is a summation of the displacements of all the sections of the electro-active structure. Therefore, electrical activation generates a rotation of the structure which generates out-of-plane displacement of the structure The displacement is most easily visualised where the minor axis is curved in a regular curve around a geometrical major axis. Such a curve may be a helix, spiral or an arc of a circle. Rotation of each section causes relative displacement of the ends of that section along the major axis. Therefore, the overall displacement is extension or contraction of the structure parallel to the major axis. However, displacement is achieved by any curve, so the major curve may be of any shape.

In fact, the displacement of an electro-active device in accordance with the present invention is quite striking to watch. Millimeters or even centimeters of displacement can be achieved. For example, a structure formed from a 0.5 mm thickness tape wound as a 4 mm diameter minor helix around the minor axis which minor helix itself curves around a major curve which is a segment of about three quarters of a circle of 30 mm diameter has been observed to produce displacement of about ±6 mm. The rotation of the structure around the minor axis is barely visible, but the net effect is a considerable displacement.

The use of such an electro-active device in a loudspeaker provides a number of advantages as follows.

Firstly, the electro-active device is efficient, that is it can provide a relatively large displacement for an electrical signal of given magnitude. As a considerable total rotation may be achieved along the length of the minor axis, a correspondingly large displacement may be achieved along the major axis. The amount of extension is proportional to overall length and size of the device. Therefore by appropriate sizing of the device, it is possible to control the displacement allowing the device to be employed in a loudspeaker having any size or power output. Therefore a conventional voice coil transducer in any known loudspeaker may be replaced by an electro-active device in accordance with the present invention. In fact an electro-active device appropriate for a given loudspeaker will be significantly lighter and more compact than the equivalent conventional voice coil.

Secondly, the electro-active device has a sufficiently wide frequency bandwidth for use in a loudspeaker and is capable of the large displacements necessary to create low frequency sound.

Also, if an electro-active material is used which has a linear field-strain characteristic, then the device will have a linear field-displacement response.

Furthermore the electro-active device may be applied to any type of loudspeaker. Particular applications achieve advantages as follows.

The present invention may be applied to any loudspeaker conventionally employing a voice coil simply by replacing the voice coil on the rear of the sound-generating element with an electro-active device of appropriate size and construction.

Alternatively, the electro-active device is positioned in front of the sound-generating element coupled to the support by a frame which is sufficiently open to allow passage of sound generated by the sound-generating element. It would be impractical to position a conventional voice coil in front of the sound-generating member because it would interfere with the generated sound. However an electro-active device in accordance with the present invention can be used without significantly deterioration in sound quality. This is because in order to produce a given amplitude vibration for a loudspeaker of a given size, it is possible to design an electro-active device which is sufficiently small or sufficiently open that the generated sound is not disrupted. The electro-active device could even act as phase plug to reduce the directionality of the loudspeaker at high frequencies.

The advantage of arranging the electro-active device in front of the sound-generating member is a reduction in the depth of the case of the loudspeaker behind the sound-generating member. Furthermore in the case that the sound-generating element is a cone defining a recess and the electro-active device is at least partially within the recess, an overall reduction in the depth of the loudspeaker is achieved.

Advantageously, the curve along which the minor axis extends is planar. This provides an axially compact arrangement. The thickness of the device is equal to the thickness of its structure. Sufficient displacement of the device may be achieved through selection of the structure itself and its length and curvature. For example use of a spiral allows the major curve to be of any length and hence produce any displacement whilst remaining planar (in the unactivated state).

Use of a planar major curve is particularly useful for producing miniature loudspeakers for applications such as mobile telephones. In this case, preferably, the support comprises a casing having a recess covered by the sound-generating element, the electro-active device being arranged in the recess to produce a compact unit for assembly in a larger device.

The present invention may also be applied to a plurality of loudspeakers arranged in an array.

Preferably, the electro-active portions have a bender construction, that is formed from a plurality of electro-active layers, at least one of which is electro-active material. The other layers may be non-active to form a unimorph construction or electro-active to form a bimorph or multimorph construction. The layers will be provided with electrodes arranged for activation of the layers. In general, the layers will face the minor axis, either perpendicularly or at an angle to the direction radial of the axis, so that bending on activation occurs around the minor axis. Such a bender construction creates a large degree of bending around the minor axis which maximises the net rotation and hence the displacement for a given applied voltage. As the structure is compliant and all the electro-active material can be fully utilised, it produces a large displacement for a given size of device.

A preferable form for the electro-active structure is a continuous electro-active member which extends along and curves around the minor axis. This form of electro-active structure is particularly easy to manufacture. For example, it may be formed by winding a deformable, continuous electro-active member into the structure.

Preferably, the continuous electro-active member extends as a helix around the minor axis as this is easy to form and maximises efficiency of the device in converting bending to displacement, or vice versa. With a helix it is easy to form a regular structure along the length of the minor axis or to introduce a variation along the length of the minor axis to modify the movement of the device. In general many shapes will provide the necessary rotation around the minor axis, and the turns of the winding may vary in shape, diameter and spacing (in this case the term 'axis' refers to the macroscopic approximate centre line of the winding; the local axis of curvature and radius of curvature vary along the minor axis).

It is also easy to envisage the operation of the device when formed as a helical tape or other continuous member. In this case, bending of the tape can clearly be understood to cause a rotation of the structure as a whole around the minor axis. Furthermore, when the major curve around the major axis is considered, it is easy to visualise the displacement of one end of the helical tape relative to the other end caused by the rotation. For example, where the minor curve extends in a circle or arc of a circle arranged horizontally, if one end is fixed, then on activation in the correct sense, the other end rises vertically, as do all points in between, the amount of vertical displacement rising progressively towards the free end. There is a sideways displacement of the minor axis along which the structure extends manifesting itself as a change in orientation of the minor axis. However, it will be apparent that other structures within the scope of the present invention cause a similar effect.

An alternative form for the electro-active structure is a plurality of discrete electro-active elements connected together. The discrete elements may be separately formed and connected by separate connecting elements. This is particularly advantageous because it allows the mechanical response of the device to be controlled by appropriate selection of the form and material of the connecting element. This means that the desired mechanical response does not restrict the choice of electro-active material.

Alternatively, the elements and connecting portions may be formed from a unitary elongate member.

The major and minor axes are of course imaginary axes but are useful for visualising and defining the device. In regular geometries the axes may be the geometrical axes of curvature or symmetry, but in general they are any axes about which the structure extends.

Embodiments of the invention are now described by way of non-limitative example with reference to the accompanying drawings in which:

FIGS. 7 to 11 illustrate a continuous electro-active member having a thickness which varies along its length;

Figure 1:
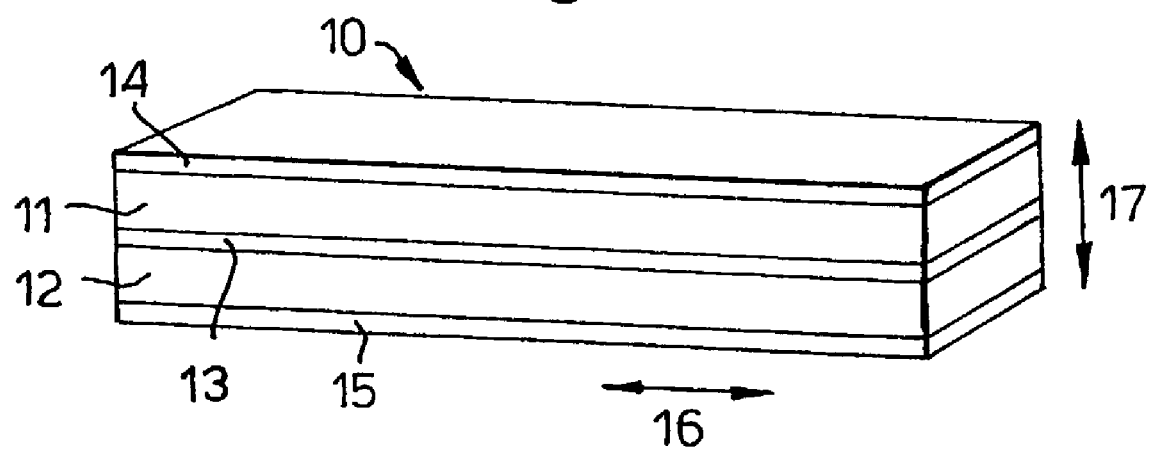
FIG. 1 is a perspective view of an electro-active portion having a bimorph construction.

Firstly, the electro-active device will be described. Then loudspeakers using the electro-active device will be described.

Electro-Active Portions

The invention provides a device, which may be a component of a larger device, in which has an electro-active structure. The electro-active structure has electro-active material in which on electrical activation a change in applied electrical field produces a change in dimensions.

The electro-active material of the device of the invention may, for instance, be a piezoelectric or electrostrictive material. On the application of an electric field across a piezoelectric material, it expands or contracts (depending on whether is poled in the same or opposite direction as the electric material) perpendicularly to the electric field. On the application of an electric field across a electrostrictive material, it contracts perpendicularly to the electric field. The electric field may be conveniently applied via a voltage on electrodes on either side of the electro-active material, preferably on its faces.

The electro-active portions preferably have a bender construction of a plurality of layers at least one of which is electro-active material. This type of construction is known for piezoelectric planar benders. The layers are arranged to alter in length differentially on activation to cause bending of the portions due to the layers being constrained where they are joined to other layers. The electro-active bender construction can have many layers. A construction including one electro-active layer together with a non-active layer, such as inactive ceramic or plastic, is known as a unimorph. On electrical activation, extension or contraction of the active layer causes the device to bend because the face attached to the non-active layer is constrained. A construction including two electro-active layers arranged to be activated in opposite senses is known as a bimorph. On activation, one layer extends and the other contracts, causing the structure to bend because the attached faces of each layer are constrained by each other. Of course, the multilayer construction may have more than two active layers, which is known as a 'multimorph', and may contain plural layers of inactive material.

The layers are provided with electrodes for activation. The positioning of the electrodes depends upon the nature and purpose of the active layers. In the case of piezoelectric devices the electrodes will include conductive activation electrodes arranged on opposite sides of a given layer and extending along the entire length of the layer. Typically the activation electrodes will be formed directly on the faces of the layer they activate, but in some arrangements other layers can be interposed. Some activation electrodes may be used to activate more than one layer. A voltage across a pair of activation electrodes causes the layer between them to extend or contract. The positioning of electrodes and formation of the electro-active layers, for example with appropriate poling to expand or contract in the correct sense, is the same as for known planar benders so is not described in detail.

As an example, FIG. 1 illustrates an electro-active portion 10 having a bi-morph construction and comprising two layers 11, 12 of electro-active material. Three activation electrodes 13, 14, 15 are provided on the faces of the layers 11, 12. In particular a common electrode 13 is provided between the layers 11, 12 and acts as a common activation electrode for both layers 11, 12. The other electrodes 14, 15 are each provided on the opposite side of a respective one of the two layers 11, 12 to act as an activation electrode for that respective layer 11, 12. To act as a bimorph, the layers 11, 12 may be poled in opposite directions by applying poling voltages to the electrodes 13, 14, 15. In that case the activation voltages are applied or developed in the same direction. Alternatively the layers 11, 12 may be poled in the same direction, in which case the activation voltages are applied or developed in opposite directions. On activation, the two layers 11, 12 expand or contract in opposite senses along the length of the electro-active portion 10 (illustrated by the arrow 16) and the electro-active portion bends perpendicularly (in the direction illustrated by arrow 17).

The material of which the active layers of the device is made may be any of the types of electro-active material discussed above, or indeed any other suitable electro-active material or combinations of different materials, but preferably it is of piezoelectric material with associated electrodes. In much of what follows, piezoelectric devices are described; however, it will be readily appreciated that similar devices can be manufactured in other electro-active materials.

The piezoelectric material can be any suitable material. A piezoelectric ceramic such as lead zirconate titanate (PZT) is satisfactory, as are other piezoelectric materials, such as polymers like PVDF (polyvinylidenefluoride).

As well as one or more electro-active layers, the structure may include non-active layers, such as inactive ceramic, which may affect the bending properties of the "bender", as in the unimorph type of bender. A similar non-active layer may be incorporated in a multilayer device, modifying the bending properties and enhancing stiffness, and hence force capability, at the expense of displacement. High force, low displacement devices may be used as actuators and positioning devices where the device is required to move another component of non-negligible mass. The inclusion of non-active layers also modifies the resonant frequency of the device, allowing tailoring of the frequency response to the particular application, and may also be chosen to provide a damping effect. Tailored resonant frequencies are important in fast moving reciprocating devices such as, for instance, loudspeakers, disc drives and optical tracking mechanisms.

External material of, say, a polymeric or elastomeric material may be applied to act as a protective and/or shock absorbing layer to prevent damage to the device during handling or operation, or perhaps to provide some modification of the device's damping properties. The external material may be applied as a further layer in a layered electro-active structure or by dipping the device in molten material to embed the device in the material after it sets.

Whilst a layered bender construction is preferred for simplicity and ease of manufacture, the electro-active structure may take other forms and constructions which allow it to bend around the minor axis on activation.

Embodiments Formed from a Continuous Member

In its preferred form, the electro-active structure is formed from a continuous electro-active member, such as an elongate tape. Where a layered construction is used, the dimensions of the member across the member parallel to the layers (hereinafter the width) and across the layers (hereinafter the thickness) may be of any size both in absolute and relative terms. For instance the width may be large relative to the thickness, for instance, 5 to 10 times larger or more. In contrast, the width may be very narrow, comparable to or less than its thickness. In general the thickness is dependent on the number and thickness of the layers used in the construction, and the width may be independently selected to provide the member with sufficient strength and bending force.

Next, is described the way in which the continuous electro-active member is arranged around the minor axis. The continuous electro-active member extends along the minor axis, and as it do so curves around the minor axis. The continuous electro-active member is arranged to bend around the minor axis. Thus adjacent finite elements of the continuous member constitute the successive electro-active portions which extend around and bend around the minor axis.

With a layered construction, the layers face the minor axis positioned at successive radial distances from the minor axis, and are poled to extend or contract along their length so that bending occurs around the minor axis. Therefore the activation electrodes for any given layer will be radially spaced on opposite sides of the given layer.

Figure 2:
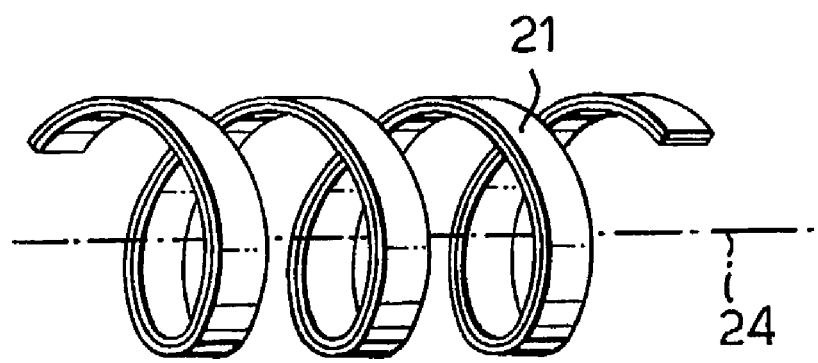
FIG. 2 is a side view of a continuous electro-active member extending in a helix.

The line of the continuous member around the minor axis may be referred to as the minor curve for ease of reference. Preferably, the continuous electro-active member is in the form of a helix extending around and along the minor axis. In the case of a helix it is clear that bending of the member around the minor axis creates rotation of the member around the minor axis, by tightening or loosening of the turns of the helix. This may be described as a "face-wound" or "tape-wound" shape. For example, FIG. 2 shows diagrammatically a flat bi-layer tape 21 extending around a minor axis 24 in a helix to form a helical electro-active structure extending along the minor axis 24.

To achieve a maximum degree of rotation around the minor axis the layers of the continuous electro-active member are oriented so that across the width of the member the layers extend parallel to the minor axis. In other words, when viewed in cross-section taken radially of the minor axis, the layers extend parallel to the minor axis. For example the tape illustrated in FIG. 2 is in this orientation. In this orientation all the bending is around the minor axis, that is the bending movement is all radial to the minor axis.

There is no component of the bending along the minor axis. Therefore all the bending contributes towards rotation of the member around the minor axis, thereby maximising that rotation.

For uniform properties, a regular helix is used. However, there are advantages in the helix being irregular. For example, it might vary in diameter or pitch along its length (like a spiral that has been pulled out, or like a helix that has been pulled longer in some parts; this could result in stronger, stiffer portions and lighter, more delicate, faster-acting portions), and/or it might not be circular (making the helix oval, say, would affect the displacement direction, enabling tailored directional movement). Moreover, it might not be smoothly wound, but instead be angularly, or "jaggedly" wound, with corners, and straight electro-active elements in between like a staircase reaching up from floor to floor. Such an angular winding would allow a greater length of material to be packed into the same space.

Figure 3:
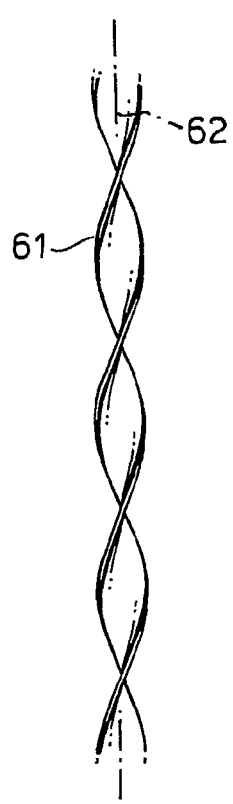
FIGS. 3 and 4 are side views of a continuous electro-active member twisted along its length.
Figure 4:
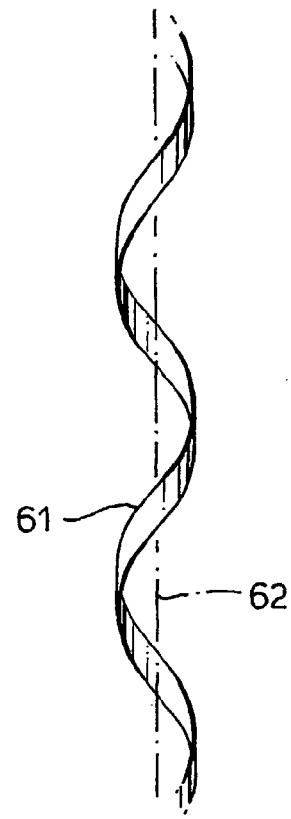

The continuous electro-active member may have geometrical forms other than a helix, indeed any other geometrical form in which some or all of the member bends around the minor axis and causes rotation of the structure as a whole around the minor axis. For example, the continuous member may be a tape having a shape in which it is twisted along its length rather than wound. This can be visualised as being formed, or indeed actually formed by holding one end of a long tape and, keeping the tape "taut", rotating the other end around the axis 62 of the tape, producing a twisted tape. For example, FIGS. 3 and 4 illustrate an electro-active tape 61 formed in such a shape around an axis 62. FIG. 3 illustrates the inactivated form. In this form, the edges of the tape describe helices winding around the central axis, while the centre line (long axis) of the tape remains at the centre, i.e. on the axis, along the whole length of the twisted tape. FIG. 4 illustrates the activated form. When the twisted tape is a piezoelectric bender as already described, activation causes the tape to bend such that the tape moves out from the central axis at all points, that is the centre line now follows a helical path around the long axis and the tape edges follow the path of a helix of greater diameter than that of the non-activated state. Such a twisted tape may be easier to manufacture than a helically-wound tape.

To achieve uniform properties along the structure, the electro-active member may be formed with the same composition, number of layers, and cross-sectional dimensions all along its length. However, for certain uses it may prove useful to have some other cross-section, say, barrelled or waisted and/or to introduce a variation in the number and type of layers, their composition, or the width and thickness along the length of the tape.

Figure 5:
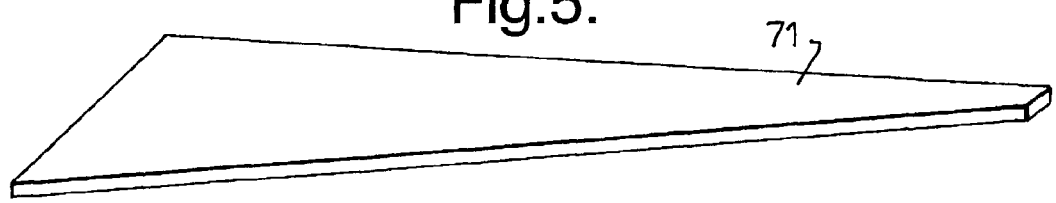
FIGS. 5 and 6 illustrate a continuous electro-active member having a width which varies along its length.
Figure 6:
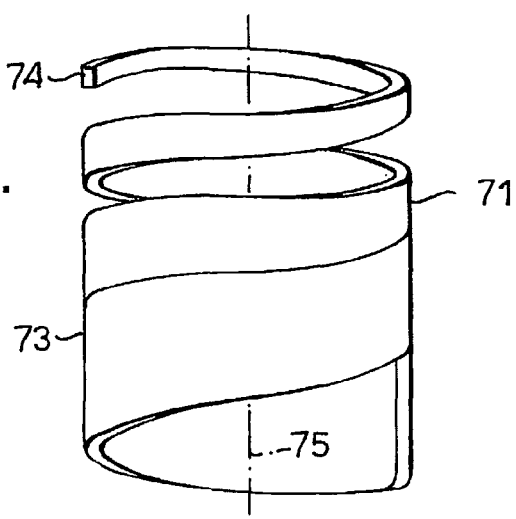

Varying the number and type of layers and their composition along the length of the structure causes a variation in activity along the length, together with a variation in mechanical properties. Likewise, a change in thickness or width varies the activity and stiffness. For example, FIGS. 5 and 6 show a bender tape 71 whose width varies along its length. FIG. 5 shows the tape 71 notionally unwound, while FIG. 6 shows such a tape 71 extending in a helix with constant pitch around a minor axis 75. The tape width at the base of the device 73 is large, while at the tip 74 the tape is narrow.

FIGS. 7 to 11 illustrates the use of a bender tape 91 whose thickness varies along its length. FIG. 7 shows the tape 91 notionally unwound, and FIG. 8 shows the tape 91 extending in a helix around a minor axis 95. FIG. 9 shows a bottom plan view at the tip 93 of the helix, and FIG. 10 shows a corresponding top plan view at the base 94 of the helix. A vertical cross-section is shown in FIG. 11, showing the variation in tape width. In such an arrangement, additional electrodes (not shown) can usefully be placed in equispaced layers in the tape to allow a constant activation field throughout the piezoelectric material.

In a simple case, a structure made from a tape which at one end is wider and/or thicker (possibly through having a greater number of layers) than the other end produces a device which is massive and stiff at one end but potentially light-weight at the other. If the massive end is fixed, the relatively massive portion of the device provides a stable and stiff base. Displacements at this end of the device are small on activation, and thus relatively little energy is used moving the heavy portion. The thinner and lighter end, however, may have very significant displacements on activation; the relatively low mass allows fast response, high accelerations, and low energy-loss high frequency movement. Such performance is ideal for devices such as loudspeaker drivers. Furthermore, the resonant frequency of the device may be tailored by selecting appropriate mass and stiffness properties along the device.

Similarly, these parameters of the tape can be varied along its length in any desired manner to provide the properties required at any point in the final device. It may be massive in the centre and light-weight at either end; it may be more massive at the ends than in the centre; or it may vary in a regular or irregular manner.

Embodiments Formed from Discrete Electro-Active Elements

An alternative form for the electro-active structure is as a plurality of discrete electro-active elements connected together. In this case the discrete electro-active elements constitute the electro-active portions which extend around and bend around the minor axis.

The elements are connected to extend around the minor axis and are arranged to bend around that axis. With a layered construction, the layers are positioned at successive radial distances from the minor axis, and are poled to extend or contract along their length so that bending occurs around the minor axis. When activated, bending of each given element around the axis relatively rotates the adjacent elements connected to the given elements around the minor axis. The elements are connected so that the relative rotations add incrementally along the axis to produce a net rotation between the ends of the structure. The electro-active elements may be separately formed and connected together by connecting elements. Alternatively the electro-active elements and connecting portions may be formed together as a unitary member.

One way to connect the electro-active elements is with successive discrete electro-active elements along the minor axis extending from the previous discrete electro-active element in the same sense around the minor axis. Looking at this another way, the angle around the minor axis at which successive connections are positioned progresses in the same sense around the minor axis. As a result, the succession of connected elements form a structure which in effect extends helically around the minor axis. In this case, bending of the successive elements in the same sense around the common axis produces the rotations which add incrementally.

Figure 12:
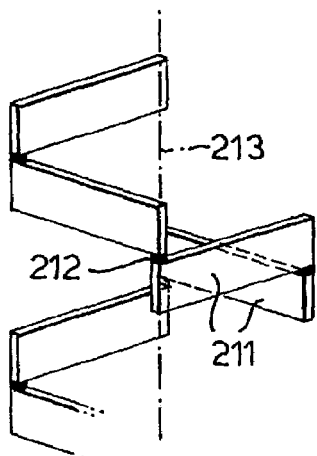
FIG. 12 is a perspective view of a section of a discrete element structure.
Figure 13:
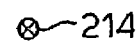
FIG. 13 is a side view of a section of a discrete element structure.

An example of a portion of such a structure is illustrated in FIG. 12. This structure consists of rectangular electro-active elements 211 which are connected together around a minor axis 213 by connecting elements 212 (described further below). Each electro-active element 211 extends at 90° relative to the adjacent electro-active elements 211, so that the structure has a square cross-section when viewed along the minor axis 213. The connecting elements 212 connect together the corners of successive elements 211. On activation the electro-active elements 211 bend perpendicularly to their faces, hence relatively rotating connected electro-active elements 211 around the axis 213. Successive electro-active elements 211 along the minor axis extending from the previous discrete electro-active element 211 in the same sense around the minor axis 213, the rotation adds incrementally. FIG. 13 shows a portion of the structure extending in a major curve around the major axis 214.

In fact, the structure of electro-active elements may take any form, provided they extend around the common axis. For example, the electro-active portions may be curved around the common axis in their inactivated shape and/or may have shapes, orientations or configurations other than rectangular.

Figure 14:
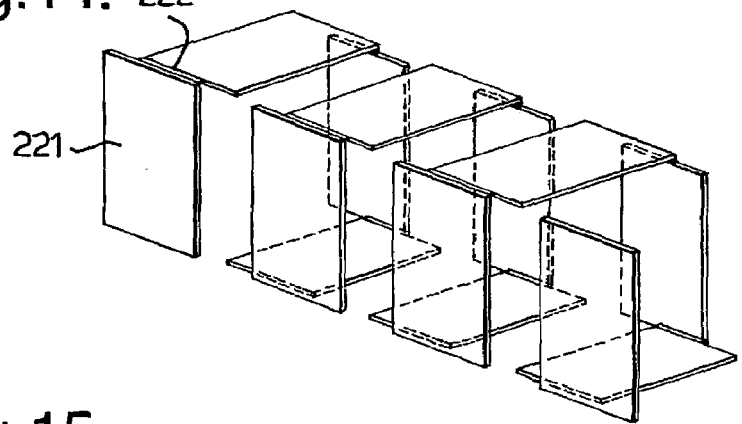
FIG. 14 is a side view of a section of a discrete element structure having an alternative connection configuration.

The electro-active elements may be connected at different positions relative to each element. For example FIG. 14 shows a structure of rectangular electro-active elements 221 which are connected by their the end edges 222 which elements 221 overlap at shifted positions relative to one another along the minor axis so that the structure as a whole progresses helically around the axis.

Figure 15:
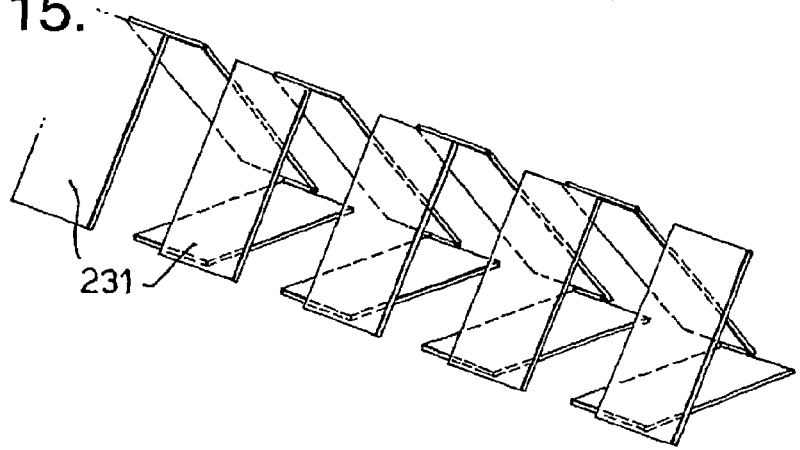
FIG. 15 is a side view of discrete element structure having a different cross-section.

The electro-active elements may be connected at any angle relative to each other. FIG. 15 illustrates a structure in which rectangular electro-active elements 231 are connected at 60° relative to each other to form a triangular cross-section when viewed along the minor axis. Any other cross-section could be selected, either regular, such as hexagonal, or irregular. Indeed in general many regular or irregular structures could be formed including structures which are far more complex than those described above.

The connecting elements may take any form provided they connect together the electro-active elements. The connecting elements may be formed from a non-active material which is then fixed to the electro-active elements. In this case, the material of the connecting element may include polymer, ceramic, metal or composite material. The connecting elements may be fixed to the electro-active elements in many ways, for example by an adhesive such as an epoxy or with a resilient fit. The connecting elements may even be simply an amount of adhesive.

Figure 16:
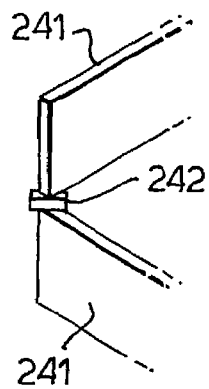
FIGS. 16 to 18 illustrate three different forms of connecting elements.
Figure 17:
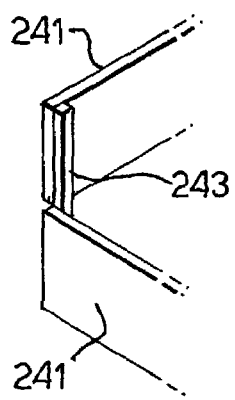
Figure 18:
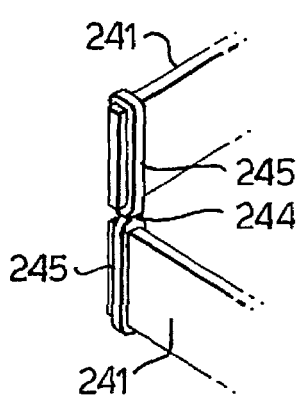
Figure 19:
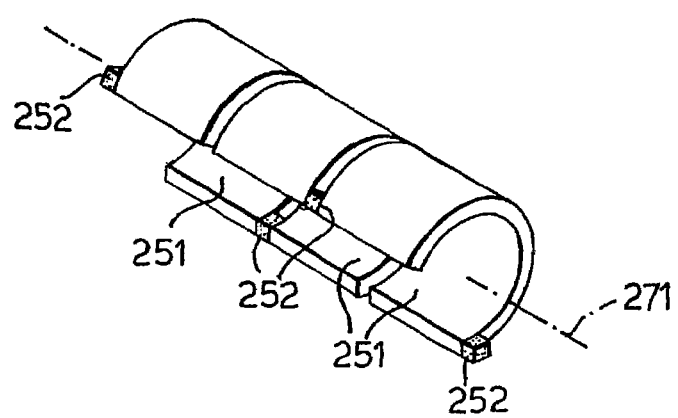
FIG. 19 illustrates a portion of a fourth discrete element structure having curved electro-active portions and alternating connection positions.

FIGS. 16 to 18 illustrate examples of connecting elements connecting electro-active elements 241. FIGS. 16 and 17 illustrate respective connecting elements 242 and 243 in the form of blocks affixed to the electro-active elements 241 eg. by adhesive. The block 242 illustrated in FIG. 16 is connected to the edges of the electro-active elements 241, whereas the connecting element 243 shown in FIG. 17 is connected to the faces of the electro-active elements 241. FIG. 18 shows a connecting element 244 consisting of a resilient elongate member having slots 245 into which the piezoelectric elements 241 are inserted and retained due to the resilience of the elongate member 244.

The wide range of choice for the material of the connecting elements such as the connecting elements 242–244 shown in FIGS. 16 to 18 allow the mechanical response of the electro-active structure to be controlled by a selection of materials having appropriate properties. This is a significant advantage. In contrast, the variation in the mechanical response of an electro-active element is comparatively restricted and difficult to control.

Successive electro-active elements along the minor axis may extend from the previous discrete electro-active element in alternate senses around the minor axis. Looking at this another way, the angle around the minor axis at which successive connections are positioned progresses in alternate senses, as an alternative to progressing in the same sense. In this case, successive electro-active elements are themselves activated to bend in alternative senses around the common axis, so that they produce rotations which add incrementally in the same sense along the axis. For example, the structure illustrated in FIG. 23 consists of curved electro-active elements 251, each extending around an arc of a circle about a common minor axis 253. The electro-active elements 251 are connected by connecting portions 252 positioned at alternate ends of the electro-active elements 251. Hence the connection portion 252 progress in alternate senses around the minor axis 252 as one moves along the axis 253.

As an alternative to using separately formed electro-active elements, the discrete electro-active elements may be formed together with connecting portions as a unitary member, an example of which is described later with reference to FIGS. 20 to 23.

The Curve Around the Major Axis

Next is considered the curve around which the minor axis is curved ie. the major curve.

In general, a major curve of any shape would produce displacement, which may vary along the device depending on the local curvature. For use in a loudspeaker, it is desired to vibrate a sound generating member in a single vibration direction. Therefore the major curve chosen is one which curves around a major axis. Consequently the displacement is along the major axis. In other words the device undergoes a change in the axial length along the major axis.

Particularly useful major curves are those which have a regular shape such as: a circle or an arc of a circle; a helix or a spiral (or a helical spiral); a double spiral; a series of stacked spirals; a series of coaxial helices. The major curve could be regular but non-circular (eg. with an oval or a square cross-section etc) or it could be irregular (that is a general curve). Moreover, the major curve could change its curvature along its length e.g., a helix with varying radius and/or pitch along its axis, for example to provide different mechanical properties along the structure. The major curve may be any curve which curves around a major axis chosen in dependence upon the space available and the displacement direction and force required. The major curve may also consist of straight portions joined by one or more bends. For example the major curve may be a regular or irregular polygon. Further, it can be only a small part of a larger curve, such as merely a fraction of a turn of a helix. The curve may subtend less than 360° at the major axis.

There now follows some specific comments on certain types of major curve. In the following description, the electro-active structures are not specifically described or are formed from a continuous electro-active member extending around the minor axis in a helix. However, the major curves may be applied to any electro-active structure, including those formed from a continuous member or from discrete electro-active elements connected together.

Figure 24:
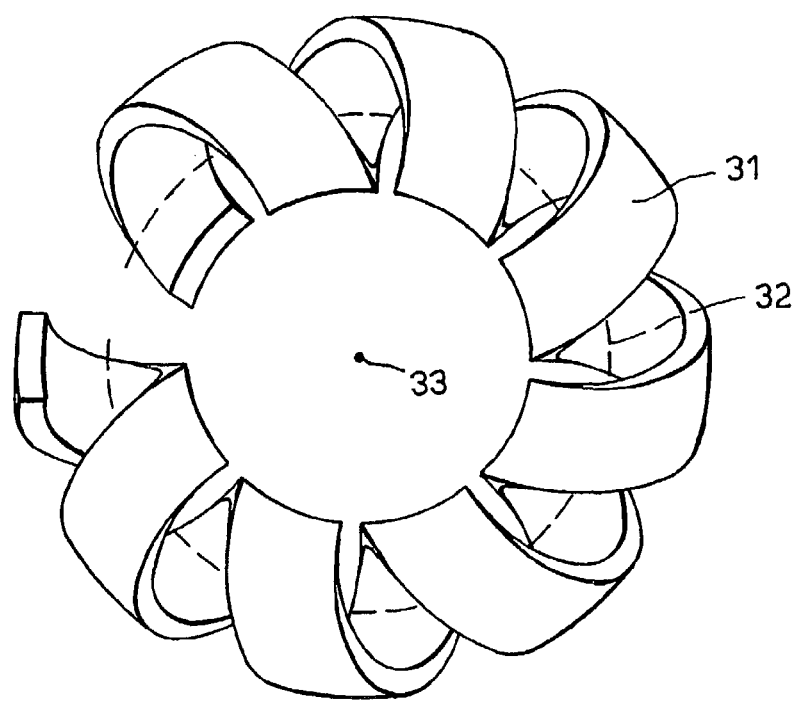
FIGS. 24 and 25 are an end view and a side view, respectively, of a structure formed from a continuous member in which the major curve is a helix of one turn.
Figure 25:
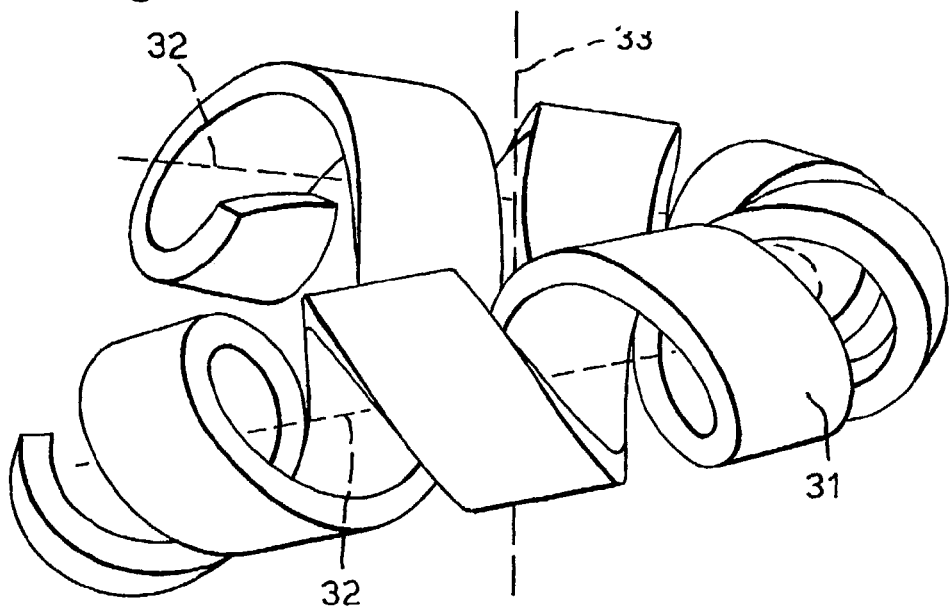
Figure 26:
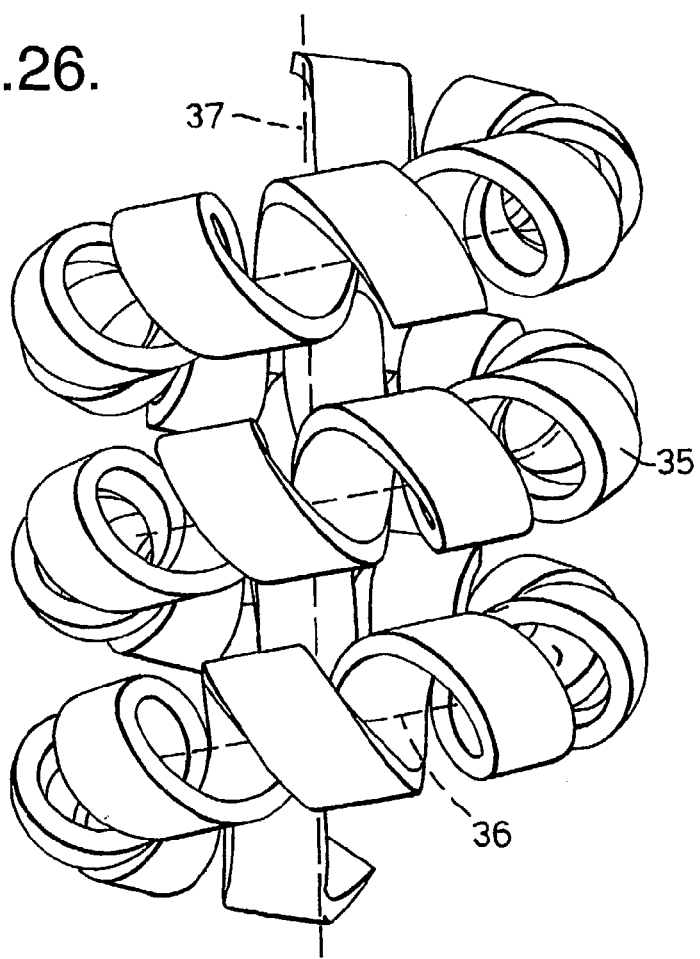
FIG. 26 is a side view of a structure formed from a continuous member in which the major curve is a helix of several turns.

The major curve may be one or more turns of a helix. For example, FIGS. 24 to 26 illustrate helical helix structures in which the major curve is a helix and the electro-active structure is a continuous electro-active member 31 or 35 extending in a helix around a minor axis 32 or 36. FIGS. 24 and 25 are an end view and a side view respectively of a structure in which the major curve is a helix of one turn around a major axis 33 (viewed axially of the major axis in FIG. 24 and radially in FIG. 25). FIG. 26 is a side view of a structure in which the major curve is a helix of several turns (for example four in FIG. 26) around a major axis 37.

The major curve being a helix provides significant displacement along the major axis of the major curve. The displacement is proportional to the length of the device, and in principle there is no limit to its length. Displacements of many centimeters are readily achievable. For instance, in a 20 turn, 30 mm diameter major helix, formed from a 4 mm diameter minor helix of 0.5 mm tape thickness, a displacement of up to 120 mm can be achieved. If the applied force is important, then greater force is available from a shorter device made from thicker tape and with a smaller major helix diameter; thus, 2 turns of a 20 mm diameter major helix made from 1 mm thick tape generates a force of about 1 N with a displacement of a few mm. Such a device is suitable for use in a loudspeaker. Other uses for the helical-helix include actuators and positioning devices such as those otherwise served by, for instance, solenoids, relays and (linear) electric motors.

Now, a number of possible major curves are described with reference to FIG. 27 to 41. In these figures the electro-active structure is shown in a diagrammatic form for ease of illustration, but the electro-active structure may take any of the forms described above, for example a continuous electro-active extending in a helix or other shape around the minor axis or a plurality of electro-active elements connected together.

FIGS. 27 to 34 illustrate some electro-active structures with different major curves around a major axis 311. In particular FIGS. 27, 29, 31 and 33 are side views of the structures, whereas the remaining views are views of the major curves illustrated by a single line. In these figures the directions in which the structures extend on activation are shown by arrows.

Figure 27:
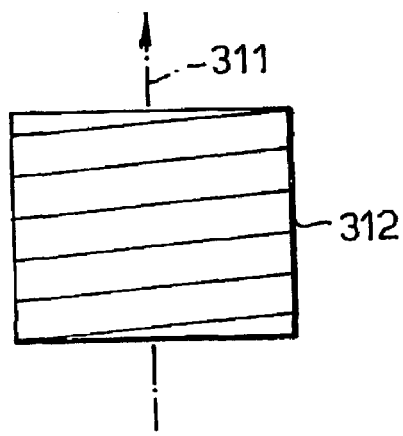
FIGS. 27 and 28 show an electro-active structure in which the major curve is a circular helix.
Figure 28:
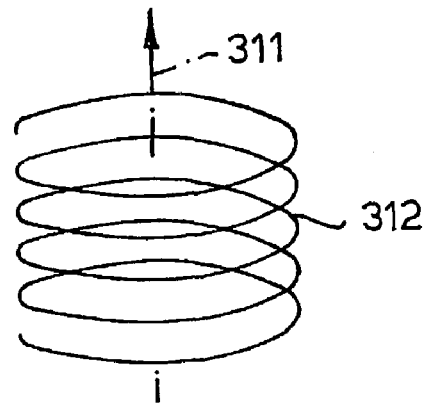
Figure 29:
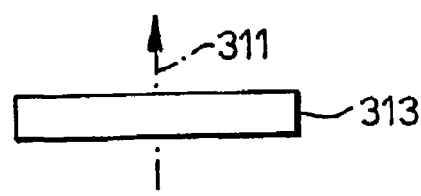
FIGS. 29 and 30A to 30C show an electro-active structure in which the major curve is a spiral.

FIGS. 27 and 28 illustrate a structure 312 extending in circular helix around the major axis 311.

Figure 30A:
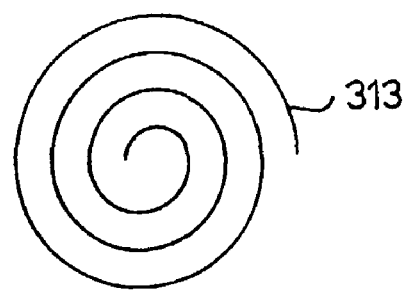
Figure 30B:
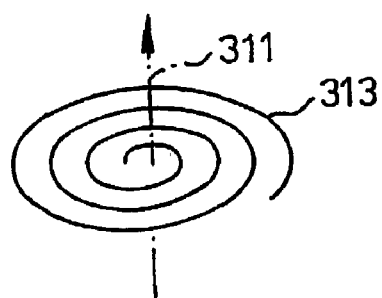
Figure 30C:
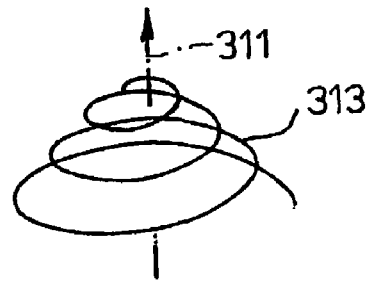

FIGS. 29 and 30A to 30C illustrate a structure 313 extending in a flat spiral major curve around a major axis 311. FIG. 30A is a top plan view, whereas FIG. 30B is a perspective view. Similarly FIG. 30C is a perspective view of the structure on activation. In the non-activated state the device 313 lies flat; its vertical height is thus merely the width of the electro-active structure. A spiral device with 2 or 3 turns may provide a vertical displacement of three times its height and more; thus, a 4 mm high spiral device may provide a displacement (of one end relative to the other) of well over 1 cm. This form is suited to applications where the space available in the axial direction is small but lateral space is less limited. The spiral can be arranged so that the end lying on the outside of the spiral is fixed while the end in the centre of the spiral moves; the actuation point is then central to the device, providing stability. Since the actuation point is at a position where the radius of curvature is small, it exhibits considerable stiffness and force capability.

Figure 31:
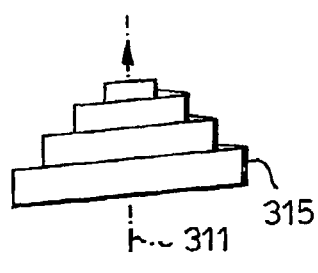
FIGS. 31 and 32 show an electro-active structure in which the major curve is a conical helix.
Figure 32:
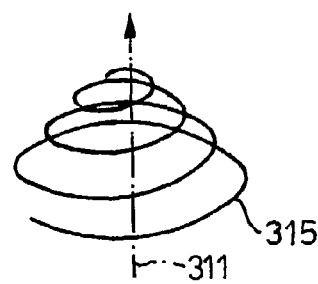

FIGS. 31 and 32 illustrate a structure 315 extending in a conical helix around a major axis 311, that is a helix in which the diameter decreases from one end to the other. The larger diameter end is relatively massive, while the smaller diameter end is relatively lightweight, which is advantageous for applications requiring fast movement, as mentioned above. Varying the pitch from one end to the other has a similar effect. Of course, these variations, like the ones discussed previously, do not need to scale simply from one end to the other; they may vary in any manner along the length of the major helix. Any of the variations discussed may be combined together, providing a very flexible means of designing a device to provide exactly the required properties.

Figure 33:
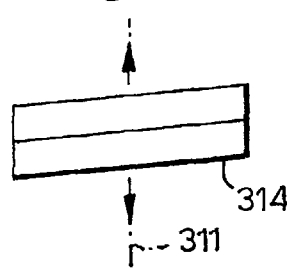
FIGS. 33, 34A and 34B show an electro-active structure in which the major curve is a double spiral.
Figure 34A:
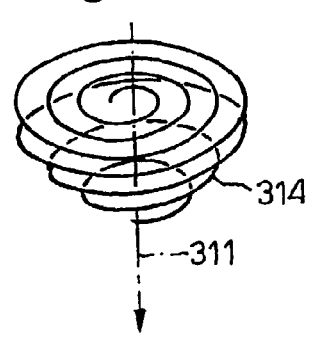
Figure 34B:
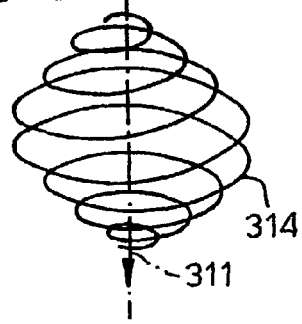

FIGS. 33, 34A and 34B illustrate a structure 314 extending in a double spiral around a major axis 311. FIG. 34A is a perspective view and FIG. 34B is a perspective view of the structure on activation. Preferably, as in FIGS. 33, 34A and 34B, the double spiral starts in the centre, winds outwards, and then winds back inwards to form a second spiral directly above the first. This provides the advantage that both ends may be central, providing directly opposed actuation points. The major curve can be extended with further spirals to provide a series of stacked spirals. Such major curves provide a very compact device, as there is very little space between the windings. Similar compactness can be achieved in a series of coaxial helices.

Although less compact, incomplete spirals, in which the turns do not extend all the way to the centre, are likely to be easier to make and still offer very significant displacements.

Figure 35B:
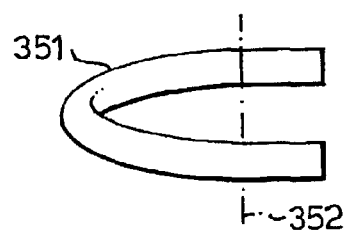
FIGS. 35A to 35C show an electro-active structure in which the major curve is an arc of a circle.
Figure 35A:
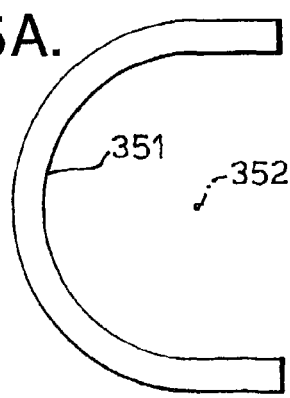

Helices and spirals provide a long length of bender, and thus relatively very large displacements. Where smaller displacements are required a shorter curve suffices, for example a circle or an arc of a circle. As an example, FIGS. 35 show a structure 351 in which the major curve is an arc of a circle around a major axis 352 which is the geometric axis of the curve. In particular, FIG. 35A is a plan view of the structure 351, and FIG. 35B is a view from the side and above.

Figure 35C:
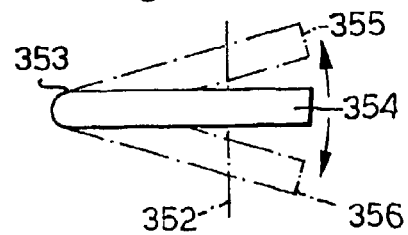

FIG. 35C shows a side view of the structure 351 with one end 353 fixed. The movement of the structure 351 on activation is shown by arrows. The structure 351 moves out of the plane of the major curve so that the free end 354 moves to a first position 355 in activation with one polarity and in the opposite direction to a second position 356 on activation with the opposite polarity. In both cases, the response is linear with position around the major curve, because the structure is uniform, thereby generating the same degree of rotation at any position around the curve which has a constant curvature.

To re-iterate, if the major curve is a regular curve such as a helix, a circle or part of a circle displacement on activation out of the plane of the curve will be in the direction of the axis of curvature. If the major curve is curved into a non-circular geometry, the movement of any section will be out of the plane of the curve of that section with the overall movement being a summation of the movements of all the sections. In the case of a major curve of a general 3-Dimensional shape, the displacement direction is determined by the geometry; so the actuation point may be caused to follow any desired path by suitable design of the major curve.

Figure 36:
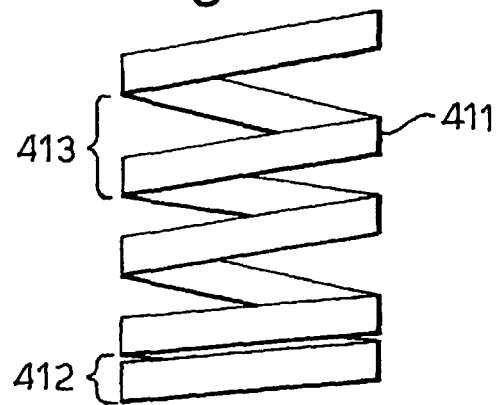
FIG. 36 shows an electro-active structure in which the major curve is a helix which varies in pitch.

FIG. 36 shows a device 411 in which the major curve is a helix of which the pitch varies along the length of the device. In the device shown, the major helix has a small pitch at its base 412 and a larger pitch at its tip 413.

The major curve need not be composed of several turns, nor even of one complete turn; it may instead be less than a single full turn (of, say, helix or circle)—though for a significant effect on activation it preferably has a total curvature of at least 30°, and most preferably at least 90°. Putting figures to this concept of tight as opposed to loose curves is rather difficult, for there is really no upper or lower limit to the size of the devices of the invention, but even so some indication can be given.

Thus, typical devices formed from a continuous electro-active member use a bimorph member of thickness around 0.1–2 mm and width of around 1–10 mm, and are shaped into a minor helix of around 1–10 mm diameter which is itself then wound into a major curve of around 2–50 mm diameter which may be helical or planar. For a typical such device made from 0.6 mm by 5 mm tape in a 4 mm diameter coil wound into a 30 mm diameter curve, the minor curve curvature is around 30° per mm of tape and the major curve curvature is around 4° per mm of coil.

Multiple Tapes and Structures

As so far described the device has a single electro-active structure formed by a single continuous member or a single plurality of discrete elements connected one after the other. This is not necessarily the case, however. A variety of more complex structures produce the same effect and are within the scope of the present invention. For example, the device could have more than one electro-active structure. The structure could be formed from two or more continuous members extending coaxially along the minor axis, perhaps forming a double helix like that of DNA. Two or more continuous members extending side-by-side, or coaxially, along the minor axis provides an extra degree of variation, as they can be activated separately, resulting in a range of motions and displacement directions of the major curve. In general when the structure is formed from continuous members, the electro-active structure may have more than one member extending in a minor curve around and along the minor axis, and/or may have more than one minor curve extending along the major curve.

Similarly, the structure may comprise two or more groups of discrete elements, the elements of each group being connected together to form a respective chain of discrete elements. Other more complicated structures of discrete elements could similarly be used.

Two or more structures may be stacked, placed coaxially or distributed to provide variations in displacement, force or load distribution. For instance, stacked spirals provide compact high displacement devices; coaxial helices provide compact high force devices; and distributed structures provide separate actuation points which can be activated either in concert or separately.

Figure 37:
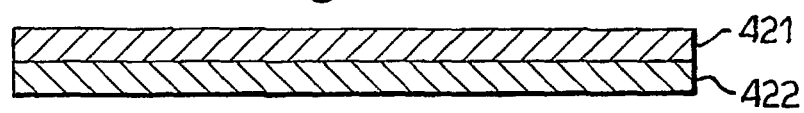
FIGS. 37 to 39 show structures formed from two electro-active members.
Figure 38:
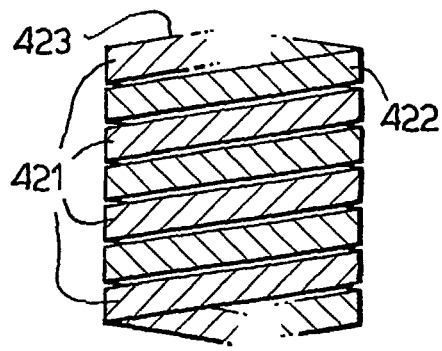
Figure 39:
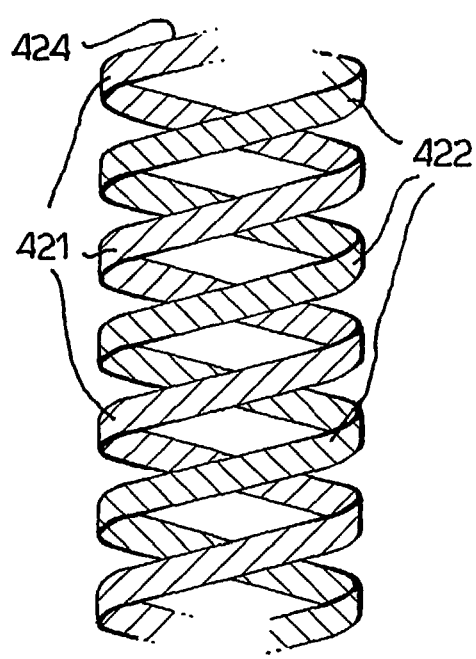

FIG. 37 to 39 illustrates structures formed from two electro-active members 421, 422 instead of one. FIG. 37 shows the structure notionally unwound so that the two electro-active members 421, 422 are arranged side-by-side. FIG. 38 shows a structure 423 wherein the members 421, 422 extend in a minor helix 423 which is close wound with minimal gaps between the members 421, 422. FIG. 39 shows a structure 423 wherein the members 421, 422 extend in a minor helix 423 with a larger pitch and hence greater gaps between the members 421, 422. This is in fact also what the close-wound structure of FIG. 38 looks like on activation.

Structure and Construction

By suitably selecting the form of the electro-active portions and the form of the structure, so there may be constructed a device having the desired properties. For the most part these will be provided by devices of a regular structure, such as the helical-helix form, but other more unusual forms might supply special results. For example, the signal input to the device to cause it to actuate might be in some way irregular—it might include imperfections and/or non-linearities—and the geometry of the device could be selected to compensate.

In the case of a device formed from a continuous electro-active member, the member is shaped as a curved curve, for example a length of the minor curve wound into a further major curve, as discussed above. Most conveniently it will in fact actually be made by first winding a flat, flexible/ plastically-deformable tape into the required curved shape—a long helix, say—and then, while the tape material is still flexible, further winding that helicoid into a suitable curved shape—say, into another helicoid (this is discussed further below). The dimensions and exact form of the tape, the minor curve and the major curve can be whatever is best suited to the purpose of the device.

For example, for use in the construction of a low frequency (<1 kHz) audio driver, a member of regular and constant rectangular cross-section of total thickness 1 mm and 8 mm width, comprising two or more active piezoelectric layers with appropriate electrodes, may advantageously be employed, this tape being wound into a 6 mm diameter minor helix and further wound into a 30 mm diameter major helix, with three turns of the major helix.

To re-iterate, some particular structures and major curves have been described above, but the device of the invention may be of any form, including curves which are regular or irregular, 2- or 3-dimensional, circular or non-circular, and of constant curvature or varying curvature (including opposite curvatures). The properties of the device can be tailored by selection of: the constitution of the layers of which the tape is made; the number of layers, tapes and minor curves; and the physical parameters of the layers, the electrodes, the tape (s), the minor curve(s) and the major curve (s). Further, any of these parameters may be varied along the length of the device, and any particular device may include variations along its length of none, some or all of these parameters.

Multiple Electrodes

In the case of embodiments formed as a continuous electro-active member, each electrode is envisaged as continuous from one end of the tape to the other. Usually the electrode will be conductive so that the same voltage appears across the entire length of the structure, although the electrodes could alternatively be resistive so that a varying voltage is developed along its length. However, the electrode may instead be split at various points along the tape, producing a multi-electrode device. In the simple case, the flat surfaces of each piezoelectric layer are covered with an electrode. If, instead, the electrode is non-continuous—that is, a break in the electrode layer running across the width of the tape is provided at intervals along the tape length, and corresponding breaks are provided in the other electrodes— then the tape consists of two or more regions along its length which are electrically isolated from each other and which can be activated separately. Once wound into a device, the multi-electrode form allows the separately-electroded sections of the device to be caused to move differentially. For instance, alternate sections of a helical-helix device could be made to be "on" or "off", allowing a helical-helix device to display axial displacement in some sections, separated by undisplaced sections. If the section activation is then reversed (those sections which were "on" turned "off" and vice versa), a wave of displacement then moves along the device, which, if on a suitable substrate, is caused to move along like a worm.

The formation of a multi-electrode device is described with reference to FIGS. 40 to 43.

Figure 40:
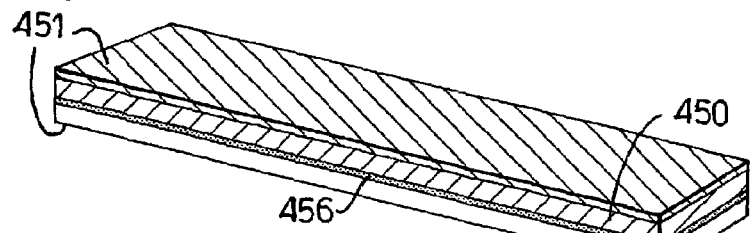
FIGS. 40 and 41 are perspective views of electro-active members respectively without and with split electrodes.
Figure 41:
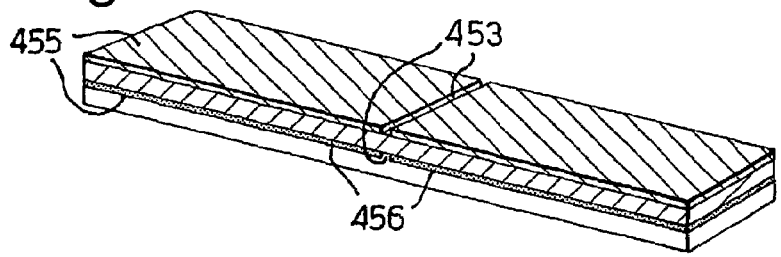
Figure 42:
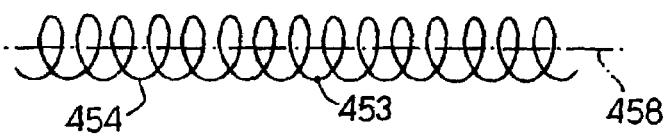
FIGS. 42 to 45 illustrate different electro-active structures having sections with separate electrodes.
Figure 43:
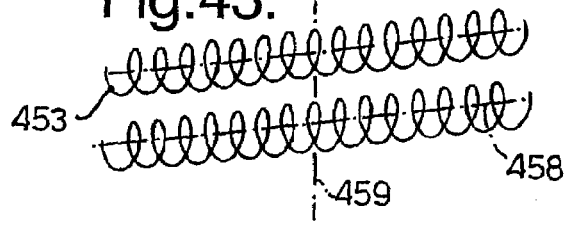

FIG. 40 shows a member of unimorph construction having an electro-active layer 450 and a non-active layer 456 with electrodes 451 applied to the two faces of a piezoelectric layer 450 in the normal manner. In contrast, FIG. 41 shows a member 454 of the same unimorph construction but in which each electrode 455 is split into two sections 452 which can be separately activated. In each case, the split 453 runs across the width of the tape, roughly halfway along it. FIG. 42 shows diagrammatically a long length of such a split-electrode member 454 extending in a minor Helix about a minor axis 457, with the location of the split 453 in the electrode midway along the helix. FIG. 43 shows a side view of the structure of FIG. 42 extending in a major curve of a helix of two turn 458 around a major axis 459, the split 453 being between the two turns 458 such that each turn 458 has separate electrodes.

Figure 44:
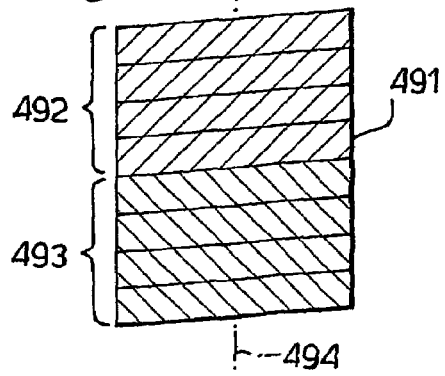
Figure 45:
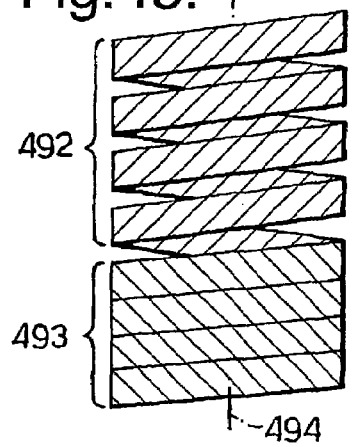

FIGS. 44 and 45 show a structure 491, for example a continuous member curved in a minor helix, extending in a helix around a major axis 494 with eight major Helix turns and two sections 492,493 with separate electrodes of four turns each (shown differently-hatched for clarity). FIG. 44 shows the structure with both sections 492,493 inactivated. FIG. 45 shows the structure with one section 492 in the inactive state, and the other section 493 in the activated state.

Figure 46:
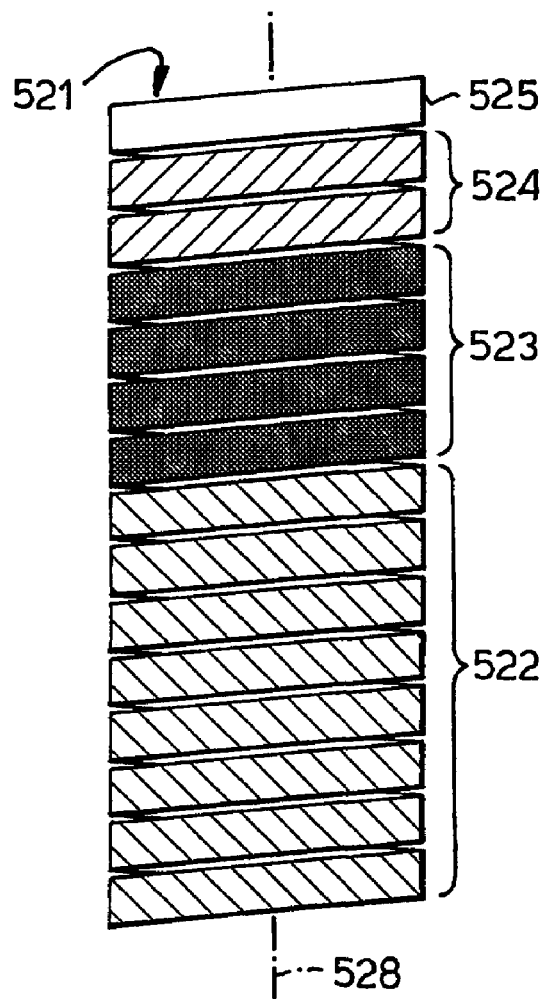
FIGS. 46 and 47 illustrate different electro-active structures having sections with separate electrodes suitable for use as digital actuators.
Figure 47:
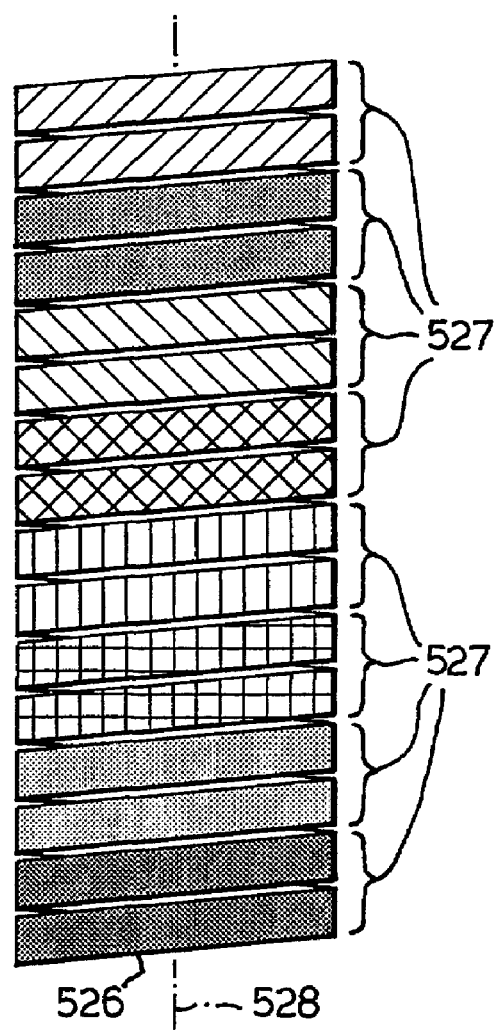

FIGS. 46 and 47 show devices having sections with separate electrodes suitable for use as digital actuators, for example, in a digital loudspeaker.

In FIG. 46, there is depicted a structure 521 extending in a helical major curve around a major axis 528 with four separately-electroded sections 522, 523, 524, 525 having eight major helix turns, four turns, two turns and one turn, respectively. Each section 522 to 525 can be activated separately, allowing the total displacement to vary directly as a binary digital activating signal. FIGS. 47 shows a 16 turn major helix 526 with eight separately electroded sections 527, suitable for use with unary digital signals. As individual sections of a multi-electroded device can be turned on separately, such that the resulting amplitude of movement is the sum of the movements of the individual sections. For instance, a major helix of 16 turns comprising 8 separately electroded sections of 2 turns each, could be activated such that only one section operates, or more than one up to a total of eight sections operate, giving 8 discrete levels of amplitude. This is particularly useful in digital loudspeakers of the unary type, as disclosed in WO-A-96/31,086. Similarly, a digital loudspeaker of the binary type would comprise separately-electroded sections which were related to each other in their length by the proportions 1:2:4:8 etc.

The disposition of activation (and sensor) electrodes described above for piezoelectric devices applies equally, with the appropriate changes, to electrostrictive devices in which the active layers are made of electrostrictive material.

Devices with Integral Sensors

The electro-active structure may include sensor electrodes the purpose of which is to output a signal generated by the sense layer between them which signal provides information as to how the device is behaving. This use of sense layers and sensor electrodes is described in some detail in GB-A-2,329,514, in the section headed "Piezoelectric driver devices with integral positioning and control mechanisms" which is incorporated herein by reference. Briefly, though, such sense layers may be single or multiple, and of piezoelectric or piezoresistive material. Each is integrated into the electro-active structure as either inner layer(s) or as surface layer(s), preferably parallel to and electrically isolated from the other piezoelectric layer or layers comprising the unimorph, bimorph or multimorph. The sense layer(s) if piezoresistive have sense terminals connected to the ends of the layer(s) at either end of the structure and if piezoelectric have sense terminals connected to electrodes covering the (radially) inner and outer surfaces of the layer(s). In the case of a piezoresistive sense layer, the sense layer acts rather like a conventional strain gauge. The provision of an electrical current through the layer, and simultaneous measurement of that current and of the voltage across the layer as measured at the sense terminals, provides a direct indication of the strain experienced by the device, and thus of its extension or contraction, which information may be used in a feedback control loop, for example, to improve the linearity of the response of the electro-active device. Such a feedback control system is able to compensate not only for load variations, but also for compensation of any hysteresis in the piezoelectric actuator itself.

Methods of Manufacture

The electro-active portions, whether formed as a continuous member or discrete elements, may be made using any known technique. They may advantageously made by extrusion or calendering, for example by co-extrusion of two (or more) layers of the chosen plasticized material or by the co-calendering of these materials, to form a unimorph, bimorph or multimorph.

A multilayered construction may be made through lamination of thinner layers, onto which electrode patterns have previously been printed. These thinner layers may be made by any suitable route, such as high shear mixing of a ceramic powder, polymer and solvent mixture, followed by extrusion and calendering. Alternative routes, such as tape casting or that referred to as the Solutech process, known in the field of ceramics, may be used.

The above techniques produce a flat, straight, continuous electro-active member which may itself be formed into the structure or cut to produce discrete electro-active elements.

Devices of the invention formed from continuous electro-active members may conveniently be made by actually winding the member into the desired form, for example by first winding the member into a long helix or other shape and then winding that structure into the major curve. In that case, there must exist in the initially formed member a degree of flexibility/plasticity such that the materials from which the member is formed may be deformed into the forms necessary.

One suitable method of manufacture is a two-stage one, and is best described with reference to making a device that is a member extending in a helix (the minor helix) around the minor axis and in which the major curve is also a helix. However it is equally applicable to other minor curves and other major curves.

In the first stage, to form the Minor Helix, electroded laminated tape in the green-state is flat-wound around a suitable cylindrical former which itself is made of a material that is able to deform plastically. This step produces a long straight helix. In the second stage this helix is itself coiled (into the major curve) by the simple method of winding the composite Minor Helix and its former around a suitably-made second former. This may be a threaded, plastically-deformable bar with the appropriate pitch and depth of thread. After this step, the tape material is allowed to set, either through cooling or through evaporation of a constituent solvent, and once set, and relatively stable physically, the two helices are freed from their respective formers (first the major helix from its former, and then the Minor Helix is removed from its former) either by simply unthreading them or, if the formers have been made of a suitable material, melting, burning or dissolving the formers away.

Once the coil is removed from the formers it is placed on a sintering former, of dimensions such as to allow for the 12–25% linear shrinkage expected during sintering. The constituent polymers are burned out of the material, typically at up to 600° C., and the material is then densified through further sintering at temperatures, typically between 1,000° C. and 1,200° C.

In an alternative manufacturing route, a multilayer tape, including the electrode layers, is produced by co-extrusion. The extrusion parameters can be set such that the emerging material is curved, for instance by arranging it so that the material emerges from the die more quickly on one side than on the other. This is a known process for other products, used for instance in the production of "Spirale" pasta in the form of a thin tube following a helical path. The minor helix is then produced direct from the extrusion die, and lengths can then be wound on to a former for production of the major helix. Removal of the former and sintering is then carried out as above.

As an alternative to forming the structure by shaping a deformable member around the minor axis, the structure may be formed from an electro-active member shaped as a cylinder with an appropriate layered construction of electro-active layers and electrodes. The cylinder may then be cut along a helical line around the cylinder to leave a continuous member extending in helix around the axis of the cylinder which forms the minor axis. In this case the electrodes are preferably conductive electrodes extending along the entire length of the member.

The electrodes may be formed in any way known for a layered electro-active structure. The electrodes may be formed as an integral part of the manufacture of the electro-active member, eg. extruded therewith. Further electrodes, which may be activation electrodes or may be terminal electrodes to allow access to the various internal and external electrodes in the member, may then be applied as an ink or through fired-on silver paste, or some other appropriate technique.

Manufacture of the electro-active structures in the form of separate electro-active elements is very simple. The electro-active elements themselves can be made using any known technique as discussed above. Then the discrete electro-active elements are simply connected together building up the structure into the desired form, for example, as shown in FIGS. 12 and 13.

As an alternative to using separately formed electro-active elements, the discrete elements may be formed as a unitary member with unitary connecting portions. For example, such a structure may be manufactured by the following method described with reference to FIGS. 20 to 23. The method uses a continuous electro-active member 261 which is formed using any known technique as discussed above.

Figure 20:
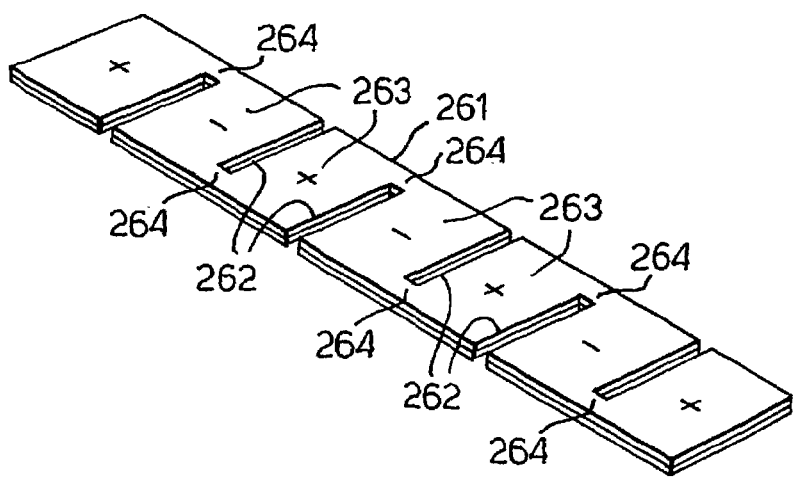
FIGS. 20 to 23 illustrate a method of manufacture of a discrete element structure as a unitary member.

In a first stage, the elongate member 261 is cut by cuts 262 extending partially across the face of the elongate member 261 from alternate sides as illustrated in FIG. 20. As a result, the elongate member 261 is shaped into connected discrete electro-active elements 263 formed longitudinally between the cuts 262 and connecting portions 264 formed between the ends of the cuts 262 and the sides of the elongate member 261. As the cuts do not sever the elongate member 261, both the elongate member 261 and the electrodes formed thereon remain continuous or unitary (although the electrodes may subsequently be split between each element 263 if it is desired to independently pole each element 263).

Alternate discrete electro-active elements 263 will be poled (post-sintering) in opposite senses as indicated by the positive and negative signs on each discrete element 263 in FIG. 20.

Figure 21:
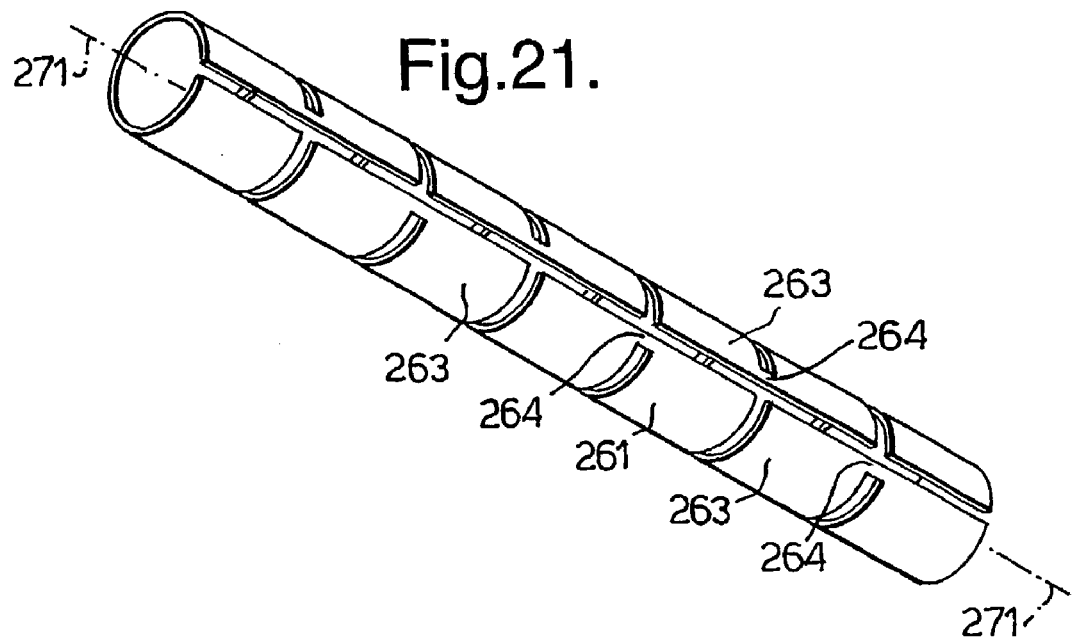
Figure 22:
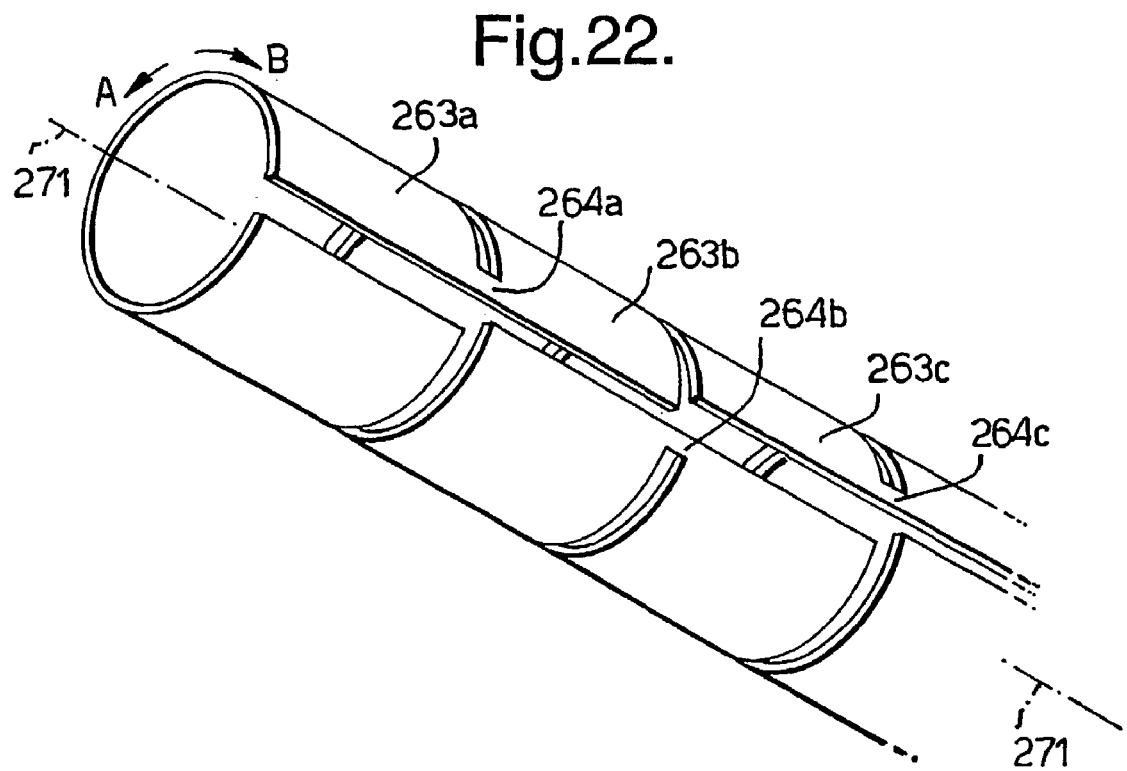

In a second stage, the elongate member 261 is curved around an axis 271 extending longitudinally along the elongate member 261, as shown in FIG. 21. Consequently, each electro-active element 263 extends circularly around the axis 271 and the connecting portions 264 progress in alternate senses around the axis 271 as one moves along the axis 271. This curving of the elongate member 261 may be performed around a former (not shown).

Figure 23:
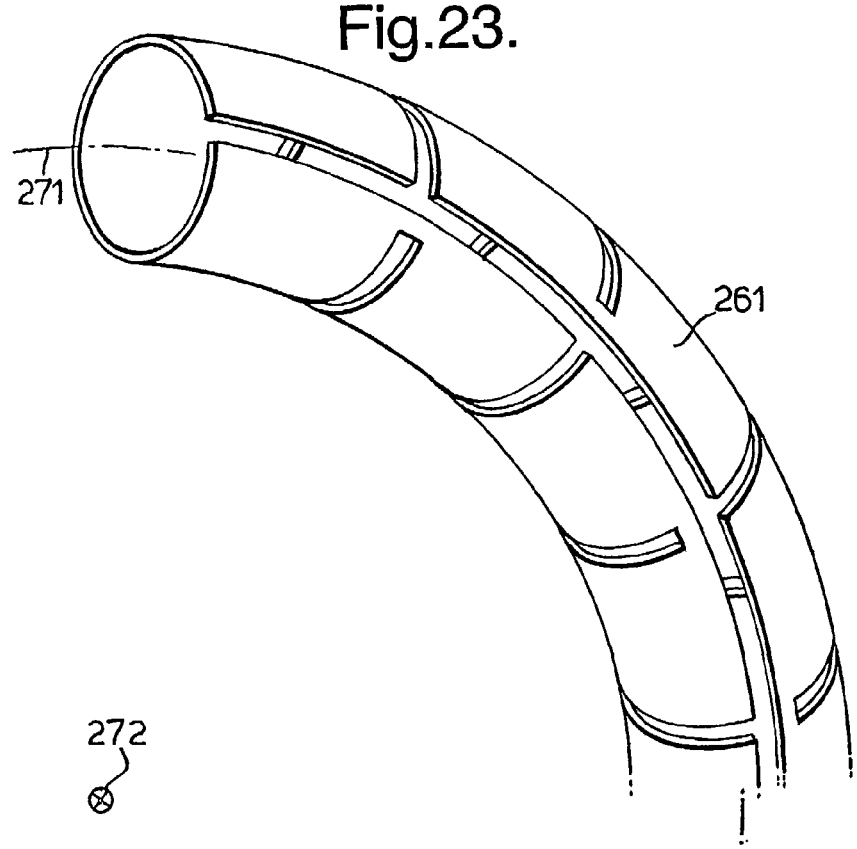

In a final, pre-sintering fabrication step, the member 261 is curved into the major curve around the major axis 271 as illustrated in FIG. 23.

In this technique, there must exist in the elongate member 261 a sufficient degree of flexibility/plasticity such that the material from which the tape is formed may be deformed into the curved forms as necessary. As described above for structures formed from a continuous member, subsequent to such forming the member may be set by heating to burn out the constituent polymers and densified through sintering typically at a higher temperature between 1000° C. and 1200° C., and finally poled.

After sintering and poling, upon activation the curved elongate member 261 rotates around the axis 271. The same voltage is applied in the same sense to each electro-active element 263. As the electro-active elements 263 are alternately poled, they bend in alternate senses around the axis. For example, along a section of the member 261 illustrated in FIG. 22, the first section 263A bends outwardly and therefore the first connecting portion 264a in a first sense A. The second portion 263b bends inwardly and rotates the second connecting portion 264b in the same sense A as the first connecting portion 264a. Similarly, the third electro-active element 263c bends outwardly and so rotates the third connecting portion 264c in that same sense A. Therefore, actuation of all the elements in alternate senses causes a relative rotation of the electro-active elements in the same sense, because the successive connecting elements progresses extend around the minor axis in alternate senses. In this way an incrementally adding rotation is generated along the length of the member 261.

In all cases, the electro-active material may be poled to allow proper activation by application of appropriate poling voltages to the electrodes.

Loudspeakers

According to the present invention, the electro-active device is used to drive the sound-generating element of a loudspeaker. It may be used to drive a loudspeaker of any type, that is any transducer used to generate sound, including sound outside of the audible range.

In general, the loudspeaker comprises a support and a sound-generating element mounted relative to the support for vibration relative to the support to generate the sound. The electro-active device is coupled between the support and the sound-generating element for vibrating the sound-generating element in response to an electrical signal applied to its electrodes. In fact, an appropriately sized electro-active device may replace the transducer, typically a voice coil, in any known loudspeaker. The electro-active device is arranged with the major axis around which the structure and minor axis extend parallel to the vibration direction of the sound-generating element. As the axial length of the structure along the major axis changes in response to the electrical signal, this vibrates the sound-generating element to generate sound.

Particular loudspeakers in which the electro-active device is applied to advantage are now described. In all the loudspeakers to be described, the electro-active device could extend along any major curve. Thus the particular major curves illustrated are merely exemplary. Similarly, the electro-active device could have any of the structures described above, so are mostly illustrated in diagrammatic form.

Figure 48:
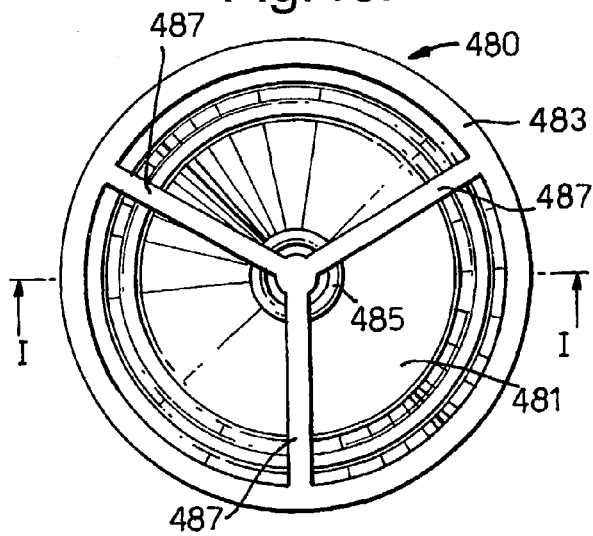
FIG. 48 is a front view of a loudspeaker using an electro-active device in front of the cone.
Figure 49:
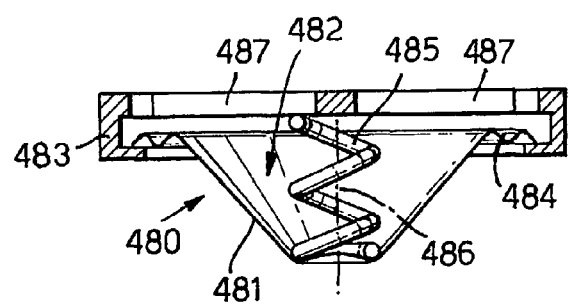
FIG. 49 is a cross-sectional view of the loudspeaker of FIG. 48 taken along the line I—I.

FIGS. 48 and 49 illustrate a loudspeaker 480 suitable for use in many consumer products such as domestic or in-car audio equipment. The loudspeaker 480 has a sound-generating element in the form of a cone 481 of conventional construction defining a recess 482. The cone 481 is mounted to a support in the form of an annular member 483 by a suspension 484 of conventional form allowing vibration to generate sound. The cone 481 is driven by an electro-active device 485 coupled to the cone 481. The electro-active device 485 has a major curve in the form of a helix around a major axis 486 extending in the vibration direction of the cone 481. An electro-active device with a different major curve could be used. The electro-active device 485 is disposed in front of the cone 481 inside the recess 482 and is coupled to the annular member 483 by a frame consisting of three arms 487 extending across the front of the cone 481. The arms 487 are relatively narrow compared to the surface area of the cone 481 and consequently are sufficiently open to allow passage of sound generated by the cone 481.

As a result of the electro-active device 485 being arranged inside the recess 482 of the cone 481 the depth of the loudspeaker 480 is significantly reduced as compared to a loudspeaker in which the transducer is positioned behind the cone 481 as is conventional. The electro-active device 485 is sufficiently small and has a sufficiently open structure that it does not significantly interfere with the sound generated by the cone 481. In fact, at high frequencies the electro-active device can act as a phase plug to reduce the directionality of the speaker. In contrast, if a conventional voice coil were placed in front of the cone of a loudspeaker this would cause significant deterioration in the output sound quality.

Figure 50:
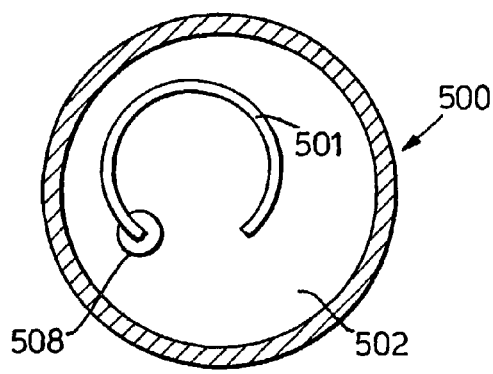
FIG. 50 is a cross-sectional plan view of a miniature loudspeaker.
Figure 51:
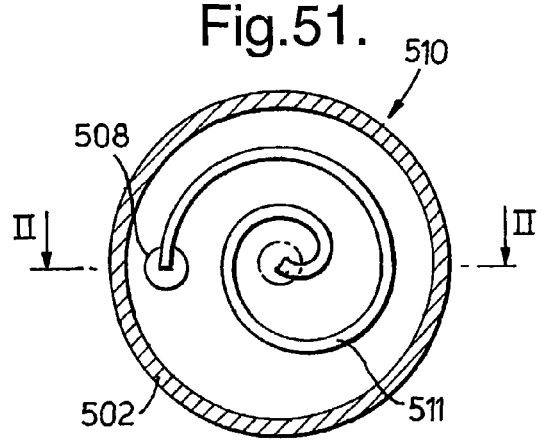
FIG. 51 is a cross-sectional plan view of a miniature loudspeaker employing a different electro-active device.
Figure 52:
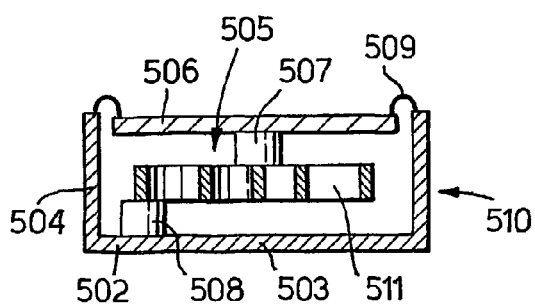
FIG. 52 is a cross-sectional side view of the loudspeaker of FIG. 51 taken along line II—II.

FIGS. 50 and 51 illustrate respective miniature loudspeakers 500, 510 each employing a respective electro-active device 501, 511 arranged with a planar major curve. The difference between the two miniature loudspeakers 500, 510 is that the electro-active device 501 of the loudspeaker 500 has a major curve which is a segment of a circle subtending less than 360° at its centre which constitutes the major axis. In contrast, the electro-active device 511 of the loudspeaker 510 has a major curve which is a spiral. Otherwise, the miniature loudspeakers 500, 510 are identical and will be described in common with reference to FIG. 52 which illustrates the loudspeaker 510 in cross-section.

The loudspeakers 500, 510 have a support in the form of a casing 502 which has a planar base wall 503 and peripheral side walls 504 defining a recess 505. The sound-generating member takes the form of a planar plate 506 which is mounted to the casing 502 covering the recess 505. The electro-active devices 501, 511 are mounted inside the recess 505 of the casing 502 extending parallel to the plate 506 and the planar base wall 503. Such an arrangement is very compact. The relatively large displacement and low weight of the electro-active devices 501, 511 allow the loudspeakers 500, 510 to have a relatively large sound-generating plate 506, and consequently produce greater amplitude sound than speakers of a similar size using known transducers. The miniature loudspeakers 500, 510 also have a better low frequency response than conventional miniature speakers.

The electro-active devices 501, 511 are mounted to the plate 506 and the planar base wall 503 of the casing 502 by respective mounts 507 and 508 at opposite ends of the electro-active devices 501, 511. The mounts 507 and 508 provide clearance between the electro-active devices 501, 511 and the plate 506 and base wall 503. This clearance allows room for the displacement of the electro-active devices 501, 511 and also provides mounting tolerance during manufacture.

Due to the linear displacement of the electro-active devices 501, 511, the plate 506 does not require radial constraint. Consequently, the plate 506 does not require a suspension to the casing 502 as would be present in a conventional loudspeaker. The loudspeaker 510 is provided with a flexible annular seal 509 between the piston 506 and the peripheral walls 504 of the casing 502 for environmental and/or acoustic sealing. However, the seal 509 is not necessary to suspend the piston 506 and is indeed optional. The absence of a conventional suspension also eliminates the non-linear effects associated with such conventional suspensions.

The electro-active device may also be advantageously applied to a loudspeaker for use in an array of loudspeakers. Ideally, a loudspeaker for use in an array has a small sound-generating area, can be closely packed and has a full range frequency response. The electro-active device in accordance with the present invention allows these requirements to be achieved. A further requirement is to produce an adequate sound pressure level from a sound-generating area which is relatively small. This is achievable by the electro-active device of the present invention because a large displacement is achievable simply by increasing the length of the major curve.

Loudspeakers which are suitable for use in an array are illustrated in FIGS. 53 to 58.

Figure 53:
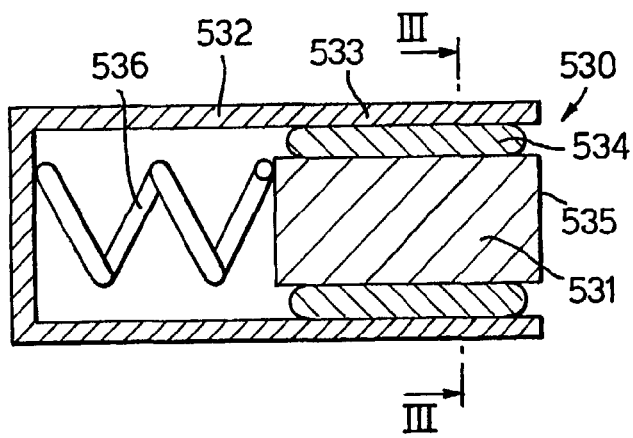
FIG. 53 is a cross-sectional axial view of a loudspeaker employing a toroidal bearing.
Figure 54:
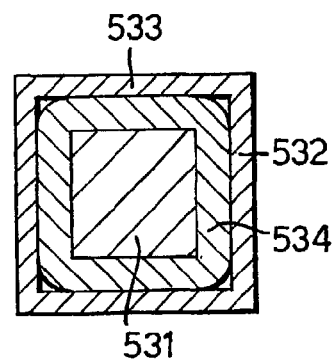
FIG. 54 is a cross-sectional view of the loudspeaker of FIG. 53 taken along line III—III.

FIGS. 53 and 54 illustrate a loudspeaker 530 in which the sound-generating member takes the form of a piston 531. The support takes the form of a casing 532 having parallel peripheral side walls 533 inside which the piston 531 is mounted by a bearing 534 which allows axial displacement of the piston 531 along the side walls 533 in a vibration direction so that the end face 535 of the piston 531 generates sound. Vibration of the piston 531 is driven by an electro-active device 536 having a helical major curve, coupled between the piston 531 and the casing 532 with its major axis parallel to the axis of the piston 531.

The bearing 534 is a resiliently-deformable toroidal member surrounding the piston 531 in the gap between the piston 531 and the side walls 533 of the casing 532. The bearing 534 may be formed from a resiliently-deformable material or from a flexible hollow envelope containing a resiliently-deformable material. Due to its resilience, the bearing 534 provides a centring force on the piston 531 and seals between the piston 531 and the casing 532, as well as allowing axial displacement of the piston 532. The bearing 534 takes the form described in detail in GB-A-2,322,232 which is incorporated herein by reference and in which further details of the bearing 534 may be found.

Figure 55:
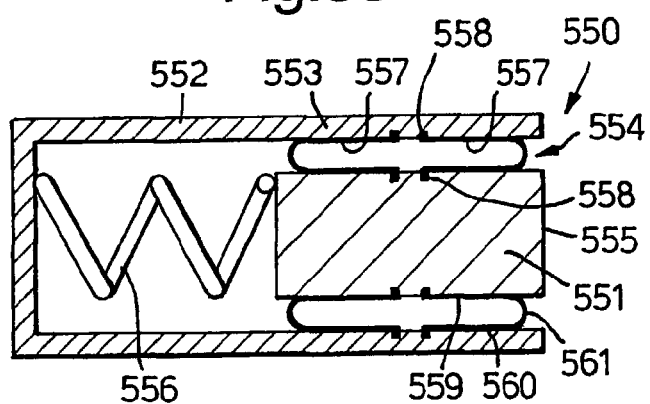
FIG. 55 is a cross-sectional axial view of a loudspeaker employing flexure strips as a bearing.
Figure 56:
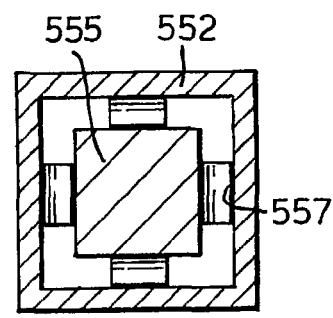
FIG. 56 is a front view of the loudspeaker of FIG. 56.

FIGS. 55 and 56 illustrate a loudspeaker 550 in which the sound-generating member takes the form of a piston 551. The support takes the form of a casing 552 having parallel peripheral side walls 553 inside which the piston 551 is mounted by a bearing 554 which allows axial displacement of the piston 551 along the side walls 553 in a vibration direction so that the end face 555 of the piston 551 generates sound. Vibration of the piston 551 is driven by an electro-active device 556 having a helical major curve, coupled between the piston 551 and the casing 552 with its major axis parallel to the axis of the piston.

The bearing 554 is formed by a plurality of resiliently-bendable flexure strips 557. The flexure strips 557 are spaced around the piston 551 on opposite sides of the piston 551. Each flexure strips is connected at one end to the piston 551 and at the other end to the side walls 553 of the casing 552 by pins 558 or any other suitable connecting means. The flexure strips 557 are arranged bent over with same face of each flexure strip 557 contacting the piston 551 and the side walls 553, and are aligned with the direction of vibration of the piston 551. Accordingly, the flexure strips allow the piston 551 to move axially within the casing 552 with straight portions 599 and 560 of the flexure strips 557 contacting the piston 551 and the side walls 553, respectively, and with a bent over portion 561 therebetween. The position of the bent over portion 561 shifts along the flexure strips 557 as the piston 551 moves. On each side of the piston 551 a pair of flexure strips 557 are provided facing in opposite axial directions. Alternatively, a single flexure strip arranged in a loop could replace the pairs of flexure strips 557 illustrated in FIG. 55.

The flexure strips 557 provide a centring force on the piston 555 in the casing 552 due to their resilient nature.

Figure 57:
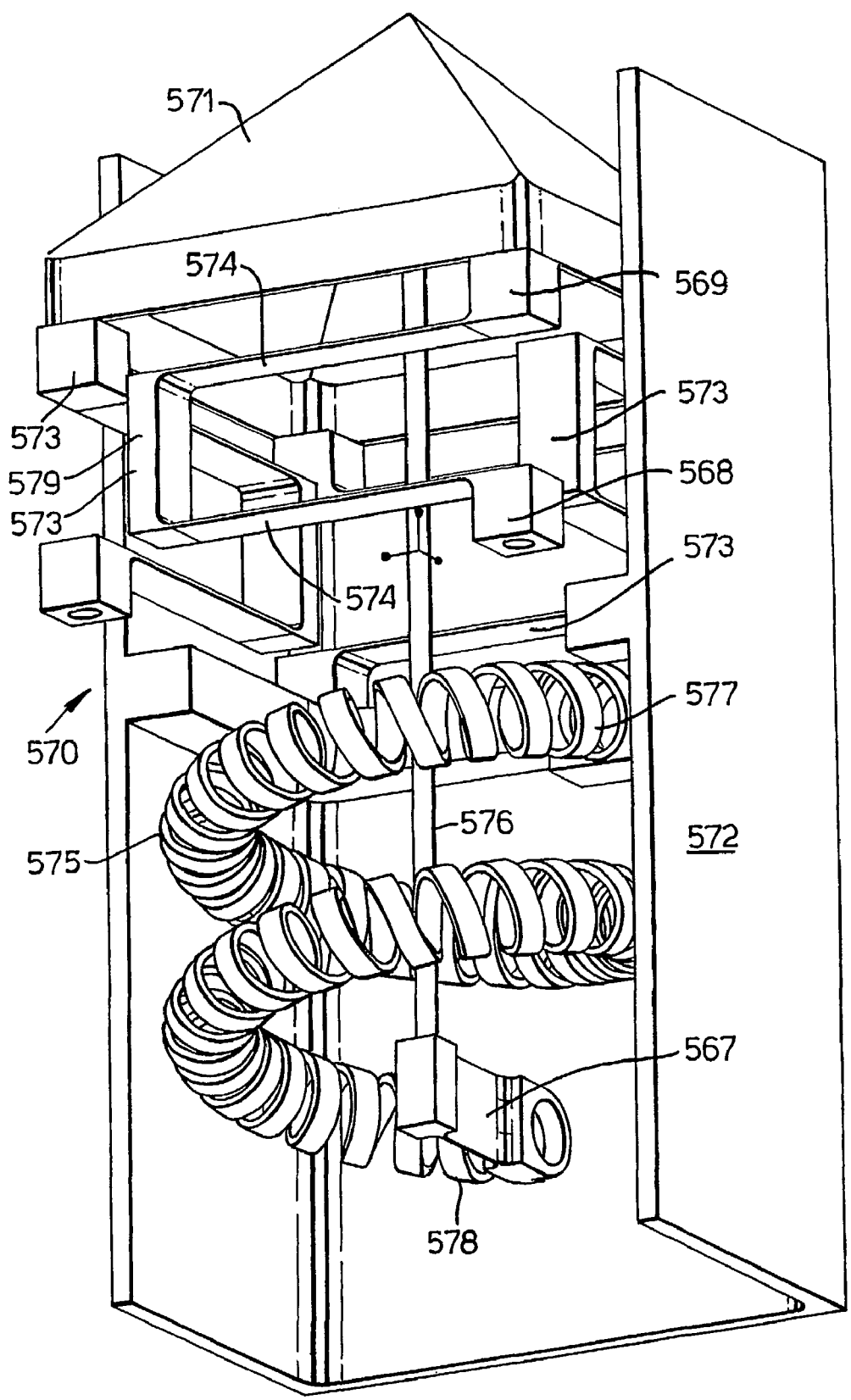
FIG. 57 is a cut-away perspective view of a loudspeaker in which the sound generating element is mounted by flexures.

FIG. 57 illustrates a loudspeaker 570 in which the sound-generating element takes the form of a plate 571 mounted by a plurality of flexures 573 to a support in the form of a casing 572. Each flexure 573 comprises a pair of flat resilient strips 574 facing the plate 571 and hence the direction in which the plate 571 vibrates. One end of each strip 574 are coupled together by a pillar 579. The other end of the strips 574 are coupled by respective mounts 568 and 569 to the casing 572 and the piston 574 respectively. The strips 574 flex resiliently in the direction in which they face, thereby allowing vibration of the plate 571 to generate sound. However, the strips 574 do not flex in other directions and hence constrain the motion of the plate 571 except in the vibration direction. Flexures 573 are arranged on each side of the piston 571 extending in different complementary directions to provide balanced supporting forces. As the flexures constrain the position of the piston 571, the loudspeaker 570 can be produced with minimal clearance between the casing 572 and the piston 571 to prevent air moving from in front of the plate 571 to behind the plate 571. This avoids the need for a seal, although a seal could be additionally provided if desired.

The electro-active device 575 is provided inside the casing 572 coupled to the sound-generating plate 571 through a rod 576 extending perpendicularly from the sound-generating face of the plate 571. The purpose of the rod 576 is to reduce the effect of misalignment due to manufacturing tolerances on the electro-active device 576 and its mountings to the casing 572. To provide a compact arrangement, the electro-active device 575 is coupled to the casing 572 at a first axial end 577 which is proximal to the plate 571, and is coupled to the rod 576 through a radially-extending link 567 at the opposite, second axial end 578 distal from the plate 571. Accordingly, the rod 576 extends through the centre of the structure of the electro-active device 575. This allows the rod 576 to be of sufficient length without significantly increasing the axial length of the loudspeaker 570 as a whole.

The electro-active device 575 is formed from a continuous member curved in a helix around the minor axis but could alternatively have any of the structures described above.

Figure 58:
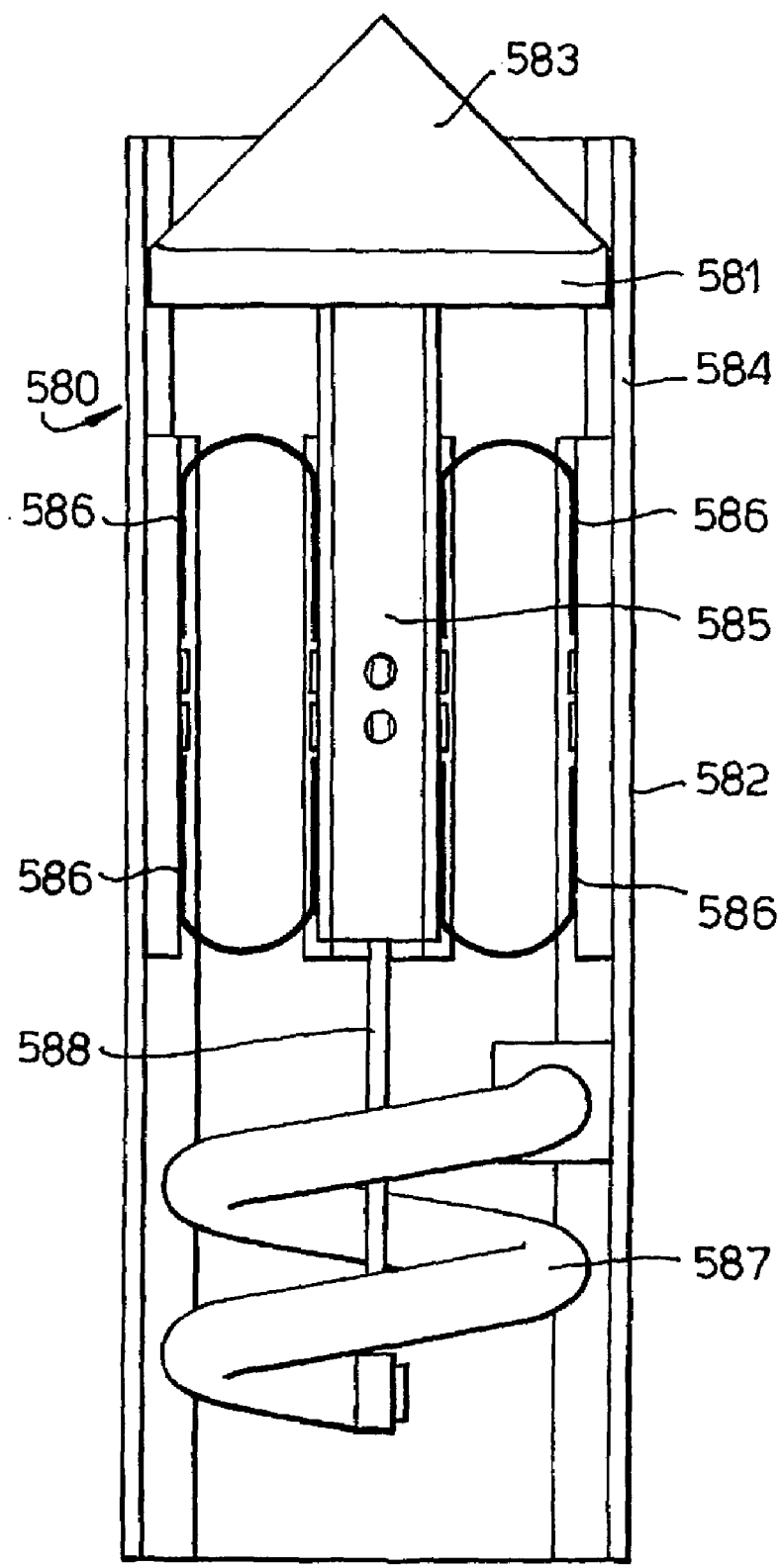
FIG. 58 is a cut-away side view of a further loudspeaker.

FIG. 58 shows a further loudspeaker 580 in which the sound generating element takes the form of a piston 581 mounted in a casing 582 which acts as the support. The piston has a head 583 fitting within peripheral side walls 584 of the casing 582 and a shaft 584 extending behind the head 583. The shaft 585 is mounted to the casing by a bearing formed by a plurality of resiliently-bendable flexure strips 586. The flexure strips 586 are identical to the flexure strips 557 of the loudspeaker 550 of FIG. 55, and are arranged around the shaft 585 in the same manner as the flexure strips are arranged around the piston 555.

An electro-active device 587 is provided inside the casing 582 coupled to the shaft 585 through a rod 588. The arrangement of the electro-active device 587 and rod 588 is identical to that of the electro-active device 575 and rod 576 of the loudspeaker 570 of FIG. 57.

The loudspeakers of FIGS. 53 to 58 are illustrated as being of rectangular cross-section as viewed from the front, but this cross-section could in fact be of any shape.

Figure 59:
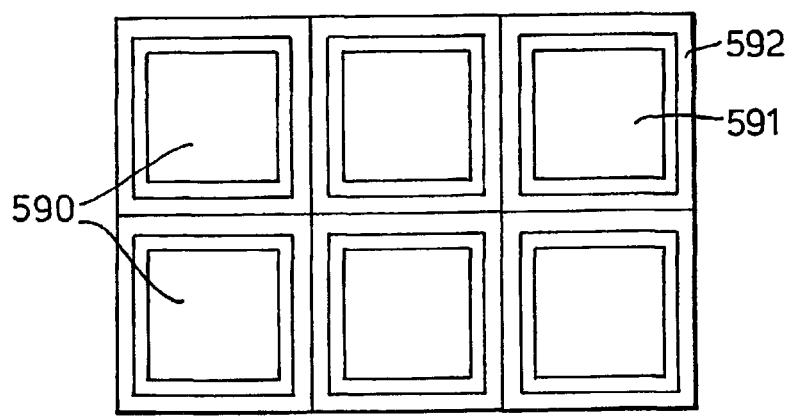
FIG. 59 is a front view of an array of loudspeakers.

The loudspeakers of FIGS. 53 to 58 may be used in an array of loudspeakers, for example as illustrated in FIG. 59 which illustrates an array of six loudspeakers 590, each comprising a sound-generating element 591 mounted in a casing 592. In general, such an array may be of any size or arrangement and may include loudspeakers of any cross-section.

Figure 60:
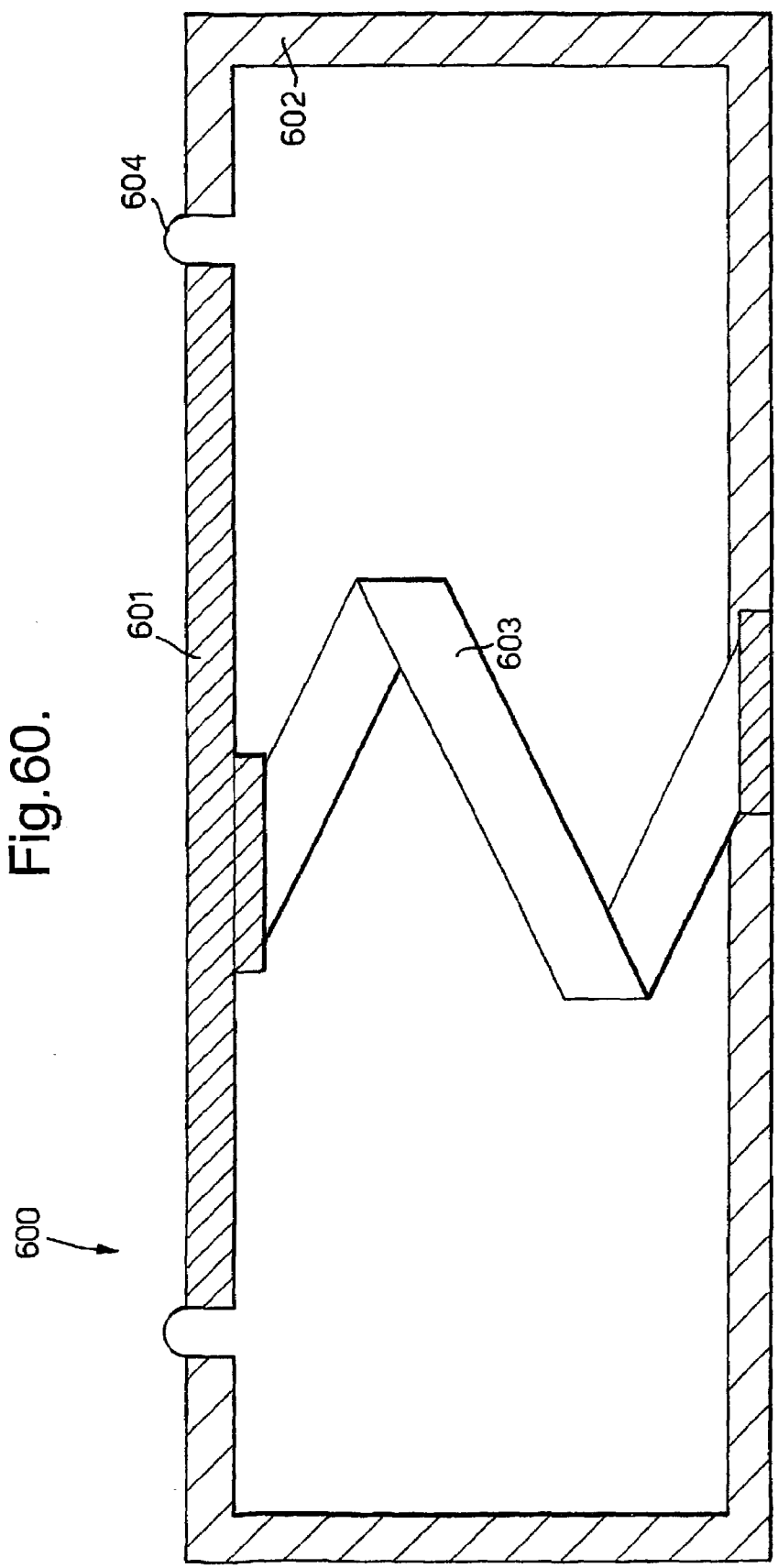
FIG. 60 is a cross-sectional side view of a device employing a loudspeaker in which the sound generating member is a liquid crystal display.
Figure 61:
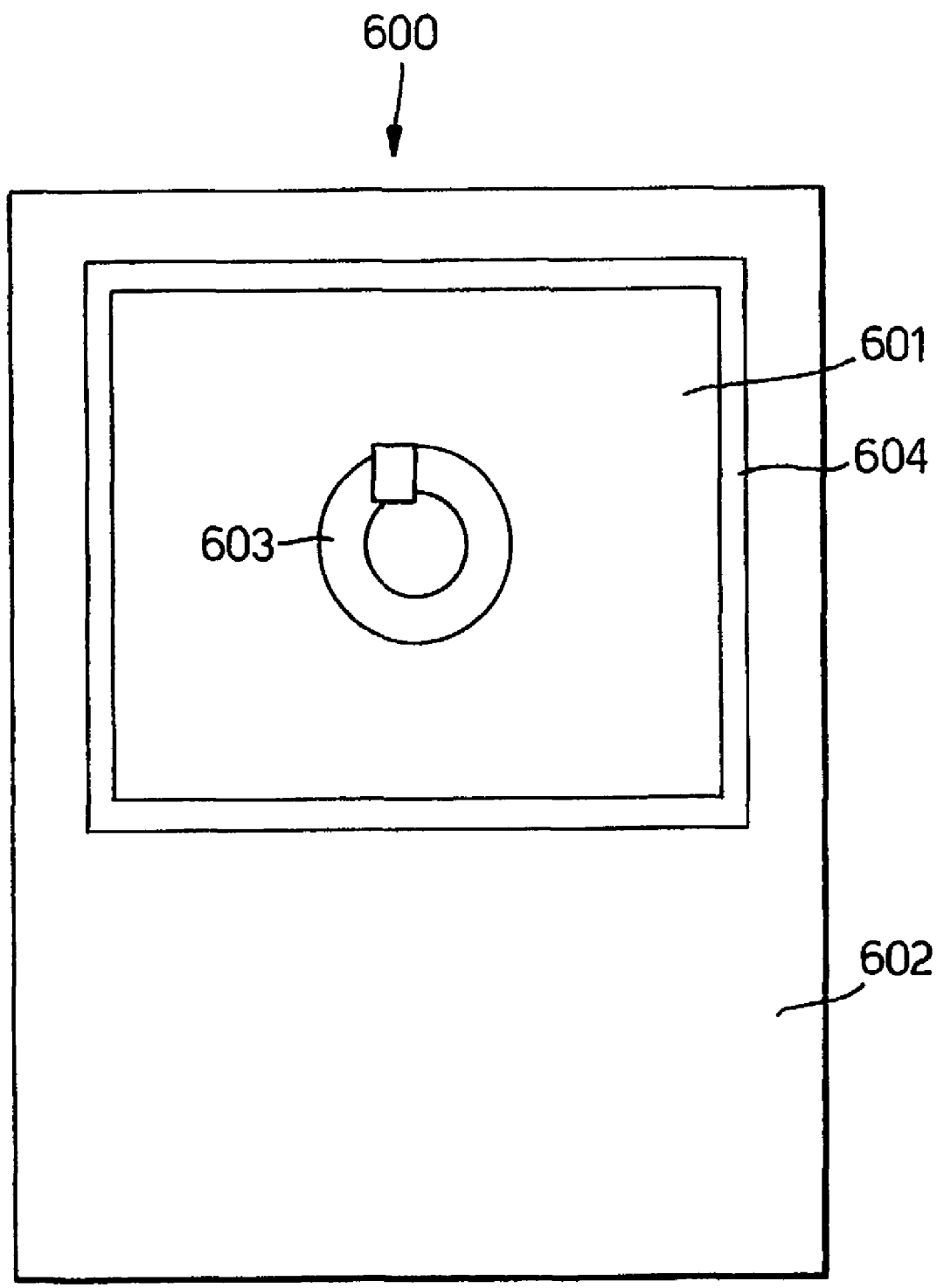
FIG. 61 is a plan view of the device of FIG. 60.

FIG. 60 illustrates an electronic device 600 having a liquid crystal display 601 (or any other type of display) which is mounted in a casing 602. The electronic device 600 could be any electronic device for example a telephone, a computer, a portable games machine, an MP3 player or a watch.

An electro-active device 603 in accordance with the present invention is coupled to the rear of the liquid crystal 601 and to the interior of the casing 602. The electro-active device 603 has a helical major curve, but could alternatively have other major curves. Accordingly, activation of the electro-active device 603 in response to electrical signals applied thereto drives vibration of the liquid crystal display 601 which therefore generates sound. Accordingly, the liquid crystal display 601 forms the sound-generating element of a loudspeaker and the casing 602 forms a support. This means it is not necessary to provide a separate loudspeaker in the electronic device 601.

The electro-active device 603 does not affect the normal operation of the liquid crystal display 601 which is controlled by conventional circuitry (not shown) in the electronic device 600. In particular, the electro-device 603 does not generate sufficient electromagnetic field to disrupt the normal operation of the liquid crystal display 601.

The liquid crystal display 601 is mounted to the casing 602 by a flexible suspension 604, preferably of rubber. Alternatively, the liquid crystal display 601 could be mounted solely by the electro-active device 603, preferably with a small clearance between the liquid crystal display 601 and the casing 602 or with a seal there between for audio and environmental sealing.

Figure 62:
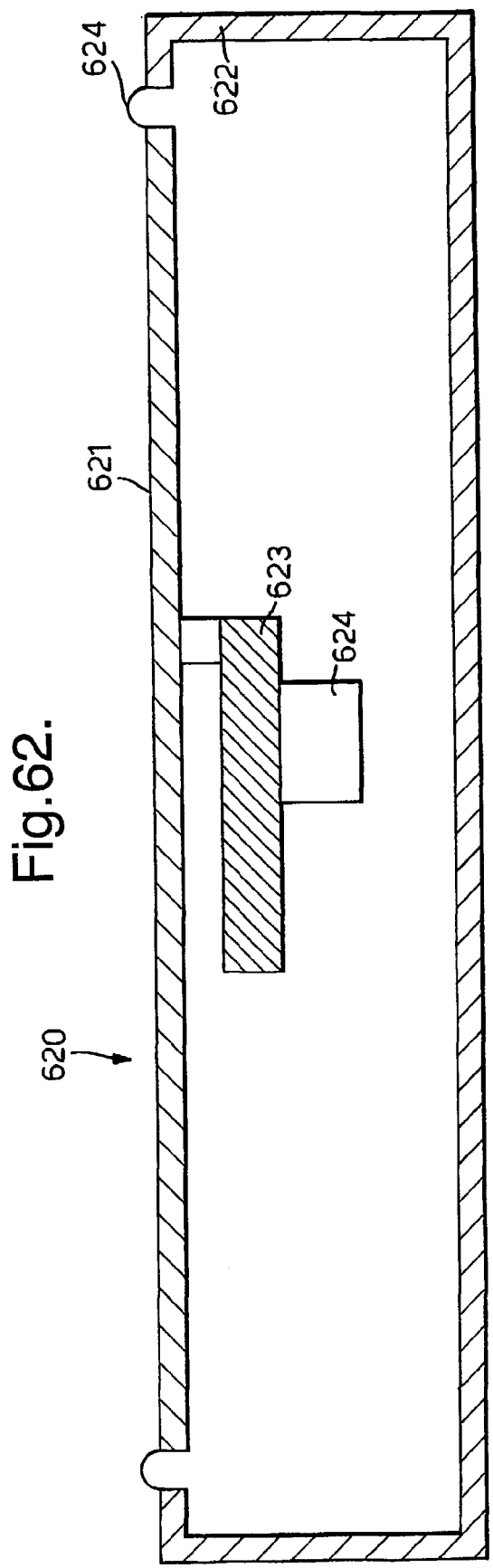
FIG. 62 is a cross-sectional side view of a further device employing a loudspeaker in which the sound generating member is a liquid crystal display.
Figure 63:
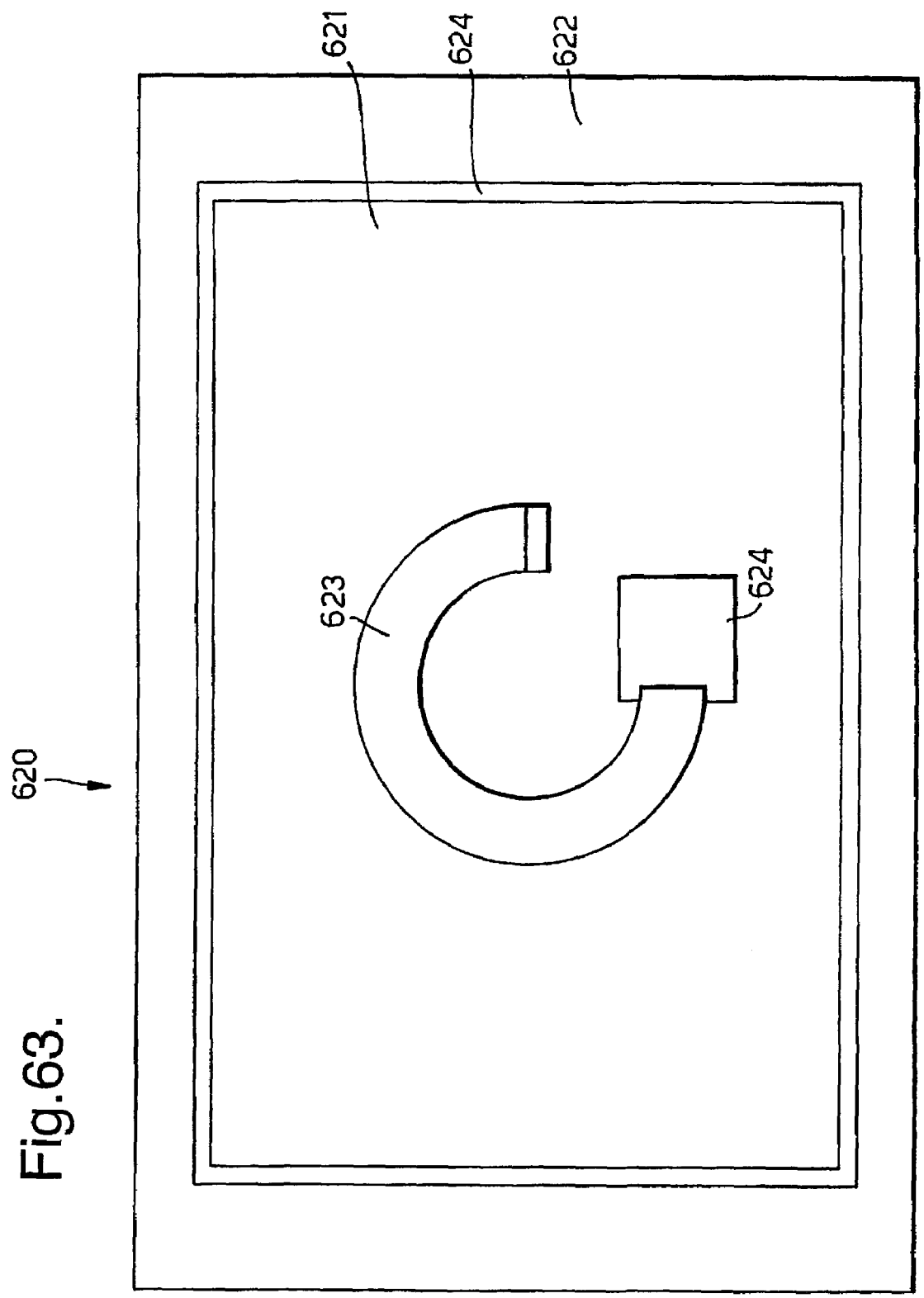
FIG. 63 is a plan view of the device of FIG. 62.

FIGS. 62 and 63 illustrate a further electronic device 620 (of any type) in which a liquid crystal display 621 (or any other type of display) is mounted to a casing 622 by a suspension 624 in an identical manner to the electronic device 600 of FIG. 60. The liquid crystal display 621 is again coupled to an electro-active device 623 which drives vibration of the liquid crystal display 621. Accordingly the liquid crystal display 621 acts as the sound-generating element of a loudspeaker and the casing 622 acts as a support.

However, the electro-active device 623 of FIG. 62 is not coupled to the casing 622. Instead the electro-active device 623 is coupled to a mass 624 at the end opposite from which it is coupled to the liquid crystal display 621. The mass 624 acts as an inertial mass relative to which the liquid display 621 vibrates to generate sound in response to electrical signals applied to the electro-active device 623.

Again, the advantage of this arrangement is that it is not necessary to provide the device 620 with a separate loudspeaker. Furthermore, the electro-active device 623 does not interfere with the operational liquid crystal display 621 because it does not generate a significant electromagnetic field.

The invention claimed is:

1. A loudspeaker, comprising:
a support;
a sound-generating element mounted relative to the support for vibration in a vibration direction to generate sound; and
an electro-active device coupled to the sound-generating element for vibrating the sound-generating element in response to an electrical signal, the electro-active device comprising a continuous electro-active member having two ends between which ends the member extends along, and curves in a helix around, a minor axis, which minor axis extends in a curve around a major axis parallel to the vibration direction of the sound-generating element, the continuous electro-active member being arranged with electrodes to bend around the minor axis on activation in response to application of the electrical signal to the electrodes, and coupled together such that bending of the continuous electro-active member causes concomitant rotation of the continuous electro-active member around the minor axis adding incrementally along the minor axis, which rotation causes concomitant relative displacement of the two ends of the continuous electro-active member along the major axis.

2. A loudspeaker as claimed in claim 1, wherein the curve along which the minor axis extends is planar.

3. A loudspeaker as claimed in claim 2, wherein the curve along which the minor axis extends subtends less than 360E at the major axis.

4. A loudspeaker as claimed in claim 2, wherein the curve along which the minor axis extends is a planar spiral.

5. A loudspeaker as claimed in claim 2, wherein the support comprises a casing having a recess covered by the sound-generating element, the electro-active device being arranged in the recess.

6. A loudspeaker as claimed in claim 5, wherein the sound-generating element is planar and extends parallel to the curve along which the minor axis extends.

7. A loudspeaker as claimed in claim 5, wherein the casing has a base wall and peripheral side walls defining the recess.

8. A loudspeaker as claimed in claim 5, wherein the electro-active device is coupled to the sound-generating element by a mount providing clearance therebetween.

9. A loudspeaker as claimed in claim 7, wherein the base wall of the casing is planar and the electro-active device is coupled to the base wall of the casing by a mount providing clearance between the base wall and the electro-active device.

10. A loudspeaker as claimed in claim 1, wherein the electro-active device is positioned in front of the sound-generating element and is coupled to the support by a frame which is sufficiently open to allow passage of sound generated by the sound-generating element.

11. A loudspeaker as claimed in claim 10, wherein the sound-generating element is a cone defining a recess and the electro-active device is at least partially within the recess.

12. A loudspeaker as claimed in claim 11, wherein the frame comprises a plurality of arms extending from the support to the electro-active device.

13. A loudspeaker as claimed in claim 10, wherein the frame comprises a plurality of arms extending from the support to the electro-active device.

14. A loudspeaker as claimed in claim 10, wherein the support comprises an annular member to which the periphery of the sound-generating member is mounted and from which the frame extends.

15. A loudspeaker as claimed in claim 1, wherein the sound-generating element is mounted to the support by a bearing.

16. A loudspeaker as claimed in claim 15, wherein the bearing comprises a resiliently-deformable toroidal member surrounding the sound-generating element.

17. A loudspeaker as claimed in claim 16, wherein the toroidal member is formed from a resiliently-deformable material.

18. A loudspeaker as claimed in claim 16, wherein the toroidal member is a flexible hollow envelope containing a resiliently-deformable material.

19. A loudspeaker as claimed in claim 15, wherein the bearing comprises a plurality of resiliently-bendable flexure strips spaced around the sound-generating element and aligned with the direction of vibration of the sound-generating element, each flexure strip being bent over with the same face of the flexure strip contacting the sound-generating element and the support.

20. A loudspeaker as claimed in claim 19, wherein each flexure strip is arranged in a loop.

21. A loudspeaker as claimed in claim 19, wherein the flexure strips are arranged in aligned pairs facing opposite directions.

22. A loudspeaker as claimed in claim 1, wherein the sound-generating element is mounted to the support by a plurality of flexures, each flexure comprising a pair of resilient strips facing the direction of vibration of the sound-generating element with one end of each strip being coupled together and the other end of the strips being coupled to the support and the sound-generating element, respectively.

23. A loudspeaker as claimed in claim 1, wherein the electro-active device is coupled to the sound-generating element by an elongate rod.

24. A loudspeaker as claimed in claim 23, wherein the curve along which the minor axis extends is a helix, the electro-active device is connected to the support at a first end of said continuous electro-active member proximal to the sound-generating element and to the elongate rod at the second end of said continuous electro-active member distal from the sound-generating element, the rod extending through the structure.

25. A loudspeaker as claimed in claim 1, wherein the sound generating member is a display.

26. A loudspeaker as claimed in claim 25, wherein the display is a liquid crystal display.

27. A loudspeaker as claimed in claim 1, wherein the minor axis extends in a curve which is one of: a helix; a spiral; a series of at least two coaxial spirals; a series of at least two coaxial helices; a circle; or an arc of a circle.

28. A loudspeaker as claimed in claim 1, wherein the minor axis subtends less than 360E at the major axis.

29. A loudspeaker as claimed in claim 1, wherein
the continuous electro-active member includes piezoelectric material; and
the piezoelectric material is a piezoelectric ceramic or a piezoelectric polymer.

30. A loudspeaker as claimed in claim 1, wherein
the continuous electro-active member includes piezoelectric material; and
the piezoelectric material is lead zirconate titanate (PZT) or polyvinylidenefluoride (PVDF).

31. A loudspeaker as claimed in claim 1, wherein the continuous electro-active member has a plurality of layers including at least one layer of electro-active material.

32. A loudspeaker as claimed in claim 31, wherein the continuous electro-active member has at least two layers of electro-active material to act as a bimorph or multimorph.

33. A loudspeaker as claimed in claim 32, wherein the continuous electro-active member has at least one sensor layer with associated electrodes in addition to the electrodes associated with said electro-active material.

34. A loudspeaker as claimed in claim 31, wherein the continuous electro-active member has at least one sensor layer with associated electrodes in addition to the electrodes associated with said electro-active material.

35. A loudspeaker as claimed in claim 31, wherein the continuous electro-active member is oriented with the layers across the width of the member extending parallel to the minor axis.

36. A loudspeaker as claimed in claim 1, wherein the continuous electro-active member has a variation along the length of the minor axis to vary the degree of bending.

37. A loudspeaker as claimed in claim 1, wherein the continuous electro-active member is provided with external polymeric or elastomeric material.

38. The loudspeaker as claimed in claim 1 provided as part of an array of loudspeakers, the plurality of which include a support, a sound-generating element mounted relative to the support for vibration in a vibration direction to generate sound, and an electro-active device coupled to the sound-generating element for vibrating the sound-generating element in response to an electrical signal and each comprising a continuous electro-active member having two ends between which ends the member extends along, and curves in a helix around, a minor axis, which minor axis extends in a curve around a major axis parallel to the vibration direction of the sound-generating element, the continuous electro-active member being arranged with electrodes to bend around the minor axis on activation in response to application of the electrical signal to the electrodes, and coupled together such that bending of the continuous electro-active member causes concomitant rotation of the continuous electro-active member around the minor axis adding incrementally along the minor axis, which rotation causes concomitant relative displacement of the two ends of the continuous electro-active member along the major axis.

* * * * *